United States Patent
Rahimo et al.

(10) Patent No.: US 11,411,076 B2
(45) Date of Patent: Aug. 9, 2022

(54) SEMICONDUCTOR DEVICE WITH FORTIFYING LAYER

(71) Applicant: mqSemi AG, Zug (CH)

(72) Inventors: Munaf Rahimo, Gaensbrunnen (CH); Iulian Nistor, Niederweningen (CH)

(73) Assignee: mqSemi AG, Zug (CH)

( * ) Notice: Subject to any disclaimer, the term of this patent is extended or adjusted under 35 U.S.C. 154(b) by 0 days.

(21) Appl. No.: 17/197,313

(22) Filed: Mar. 10, 2021

(65) Prior Publication Data
US 2021/0288139 A1 Sep. 16, 2021

(51) Int. Cl.
*H01L 29/06* (2006.01)
*H01L 29/739* (2006.01)
*H01L 29/78* (2006.01)

(52) U.S. Cl.
CPC ...... *H01L 29/0607* (2013.01); *H01L 29/7397* (2013.01); *H01L 29/7813* (2013.01); *H01L 29/7825* (2013.01)

(58) Field of Classification Search
CPC ............. H01L 29/0607; H01L 29/7397; H01L 29/7813; H01L 29/7825
USPC ........................................................ 257/288
See application file for complete search history.

(56) References Cited

U.S. PATENT DOCUMENTS

| | | |
|---|---|---|
| 5,795,793 A | 8/1998 | Kinzer |
| 6,380,586 B1 | 4/2002 | Koshikawa |
| 7,948,005 B2 * | 5/2011 | Mori .................... H01L 29/7397 257/132 |
| 8,441,046 B2 | 5/2013 | Bobde |
| 9,064,925 B2 | 6/2015 | Rahimo |
| 9,093,522 B1 * | 7/2015 | Zeng ................. H01L 29/66348 |
| 9,455,340 B2 | 9/2016 | Rahimo |
| 2015/0357449 A1 * | 12/2015 | Huesken ............. H01L 29/7395 257/144 |
| 2016/0035821 A1 * | 2/2016 | Pfirsch ................ H01L 29/7397 257/139 |

(Continued)

OTHER PUBLICATIONS

Zeng, et al., "Numerical analysis of a trench VDMOST structure with no quasi-saturation," in Solid-State Electronics, vol. 38, Issue 4, 1995, pp. 821-828, ISSN 0038-1101.

(Continued)

*Primary Examiner* — Igwe U Anya
(74) *Attorney, Agent, or Firm* — Tarolli, Sundheim, Covell & Tummino LLP

(57) ABSTRACT

Power transistors relying on planar MOS cell designs suffer from the "hole drainage effect"; addition of an enhancement layer creates significant loss of breakdown voltage capability. The Fortified Enhanced Planar MOS cell design provides an alternative that uses enhancement layers, field oxides, and gate trenches without suffering from the loss of blocking voltage. A low doped P-type "fortifying layer" reduces the high peak electric fields that develop in blocking mode in critical regions. The fortifying layer can be electrically biased through an additional electrical contact, which can be arranged at die level, not at transistor cell level. Due to the low dopant concentration of the fortifying layer, no additional MOS channels need to be formed, and the electrons will flow thru the non-inverted regions of the fortifying layer. The new design shows advantages in performance, ease of processing, and applicability.

20 Claims, 25 Drawing Sheets

(56) References Cited

U.S. PATENT DOCUMENTS

2019/0006496 A1  1/2019  Kanda

OTHER PUBLICATIONS

Spulber, et al., "A novel gate geometry for the IGBT: the trench planar insulated gate bipolar transistor (TPIGBT)," in IEEE Electron Device Letters, vol. 20, No. 11, pp. 580-582, Nov. 1999, doi: 10.1109/55.798050.

* cited by examiner

- PRIOR ART -

- PRIOR ART -

- PRIOR ART -

- PRIOR ART -

- PRIOR ART -

- PRIOR ART -

- PRIOR ART -

SEMICONDUCTOR DEVICE WITH FORTIFYING LAYER

CROSS-REFERENCE TO RELATED APPLICATIONS

The present application claims priority to GB Patent Application No. 2003441.9 filed on 10 Mar. 2020. The entirety of this application is hereby incorporated by reference for all purposes.

FIELD OF THE INVENTION

The invention relates to the field of power semiconductor devices. Power semiconductor devices that are able to withstand a blocking voltage of several hundred Volts at high current rating are typically implemented as vertical or lateral structures, wherein the semiconductor substrate is based for example on a semiconducting material such as silicon (Si) or silicon carbide (SiC) or diamond or gallium oxide (Ga2O3) or gallium nitride (GaN) or zinc oxide (ZnO).

BACKGROUND

Planar and Trench MOS transistor cell designs exhibit a number of advantages and disadvantages for IGBT and MOSFET designs. For IGBTs, typical Planar and Trench designs are shown in FIGS. 1A and 2A. Both designs can incorporate an enhancement n-type layer for improved excess carrier storage as shown in FIG. 1B for a planar structure, and FIG. 2B for a trench structure.

FIG. 1A shows a prior art IGBT with planar gate electrodes in accordance to U.S. Pat. No. 5,795,793, for example. The IGBT 100 is a device with a four-layer structure, which are arranged between an emitter electrode (3) on an emitter side (31) and a collector electrode (2) on a collector side (21), which is arranged opposite of the emitter side (31). An (N-) doped drift layer (4) is arranged between the emitter side (31) and the collector side (21). A P-doped planar base layer (9) is arranged between the drift layer (4) and the emitter electrode (3). A planar N-doped source region (7) is arranged on the emitter side (31) embedded into the planar base layer (9) and contact opening (14) to the emitter electrode (3). In addition, a planar P-doped layer (8) is arranged on the emitter side (31) below region (7) and embedded into the planar base layer (9), and a contact opening (14) through region (7) and extending to region (8) is formed for the emitter electrode (3).

A planar gate electrode (10) is arranged on top of the emitter side (31). The planar gate electrode (10) is electrically insulated from the planar base layer (9), the planar source region (7) and the drift layer (4) by a planar insulating layer (12). There is a further insulating layer (13) arranged between the planar gate electrode (10) and the emitter electrode (3). On the collector side (21), and at the surface of the drift layer (4), an N-doped buffer or field stop layer (5) can also be used in Punch-Through designs. Finally, to ensure the bipolar operating regime, a P-doped collector layer is further formed on the buffer layer.

In some prior art Planar designs, such as the IGBT 102 depicted in FIG. 1C, it is also possible to include a further insulating layer (13') formed adjacent to the planar insulating layer (12), and extending on top of the emitter side (31) in direct contact with the drift layer (4). The layer (13') is a field oxide layer, and usually has a larger thickness than the planar insulating layer (12). Its purpose is mainly to increase the controllability of the semiconductor device by adjusting the value of the input gate capacitance in the regions under the field oxide, located between adjacent IGBT cells. On the other hand, the field oxide layer (13') will also generate high electric fields between the cells which would adversely affect the breakdown voltage blocking capability.

The Planar design in general provides good blocking capability due to low peak fields at the cell and in between the cells. The Planar design can also provide good controllability and low switching losses and the cell densities in planar designs are easily adjusted for the required short circuit currents. Due to the fact that there exist few high peak electric fields in the gate oxide regions, the planar design offers good reliability with respect to parameter shifting during operation under high voltages.

During the IGBT conduction mode, hole carriers are injected from layer (6) and further flow into the drift layer (4) due to electron flow into collector layer (6) from the drift layer (4). These minority charge carriers will flow unobstructed into the base layers (8) and (9) and will be extracted from the device thru the emitter electrode (3). As a consequence, the hole carrier concentration is lower at the emitter side, and the conduction losses are high, also called "hole drainage effect". Therefore, N-type carrier enhancement layers (17), also called "hole barrier layers", have been used previously in planar cells, resulting in lower on-state losses rivalling those achieved with trench designs, as described for example in the U.S. Pat. No. 9,455,340. The enhancement layer or hole barrier layer (17) is formed on the emitter side (31), and is arranged between the first base layer (9) and the drift layer (4) such that the enhancement layer (17) encloses the first base layer (9) towards the drift layer (4). Due to the presence of the enhancement layers, there is an improvement in hole carrier distribution, current enhancement at the IGBT channel, and improved latch up properties, so that on-state losses are reduced. However, the addition of an enhancement layer (17) will generate high peak electric fields at the main PN junction (between the first base layer (9) and the enhancement layer (17)), and thus will reduce the device blocking voltage capability. This also limits the maximum practical peak doping concentration of the enhancement layers (17). Therefore, many efforts in prior art focused on increasing the dopant concentrations of the enhancement layer without affecting the breakdown voltage blocking capability for improved carrier enhancement. In particular, for some designs using field oxide layers (13'), it has proved to be even more challenging to use an enhancement layer (17) without further reducing the breakdown voltage blocking capability due to the combined effect of the enhancement layer (17) and the field oxide layer (13').

In a somewhat related prior art, the U.S. Pat. No. 7,948,005 describes the problem that increasing the dopant concentration of the enhancement layer negatively results in lowering the breakdown voltage of the power semiconductor. Above a threshold value of the sheet carrier concentration of the enhancement layer (17) beyond $1 \times 10^{12}/cm^2$, the breakdown voltage value is heavily reduced, so from the practical viewpoint no further increase in the dopant concentration of layer (17) can be achieved. The concept proposed in the prior art uses an additional P-doped layer ("intervention layer") of highly doped concentration of about $10^{17}/cm^3$, formed adjacent to the enhancement layer and in between the enhancement layer and the drift layer. Under this condition, it was possible to increase the concentration of the enhancement layer to similar values of about $10^{17}/cm^3$ without sacrificing the breakdown voltage. The P-doped layer helps in suppressing the significant electric field developed at the junction between the first base layer of P-type doping, and the enhancement layer of N-type doping. However, due to the particular arrangement of the layers, and due to the high dopant concentration of the additional P-type layer, there will be an additional MOS channel formed when the gate electrode is biased with a positive voltage. The final structure deviates from the basic IGBT structure by forming a thyristor type structure in series with a MOSFET with potential limited short circuit capability.

The trench cell concept for the IGBT 200 shown in FIG. 2A offers a vertical MOS channel (16) which provides enhanced injection of electrons in the vertical direction and suffer from no drawbacks from charge spreading (JFET effect) near the cell. Therefore, the IGBT with trench gate (11) cells show much improved carrier enhancement for lower conduction losses. Due to the vertical channel design, the trench offers also less hole drain effect (PNP effect) due to the improved electron spreading out of the MOS channel. Modern Trench designs adopting mesa widths (trench to trench distance) below 1 μm achieve very low conduction losses since closely packed trenches can provide a strong barrier to hole drainage. Matching such a performance with less complex processes can be of a great advantage. The accumulation layer at the bottom of the trench gate (11) offers strong charge enhancement for the PIN diode part. Hence wide and/or deep trenches show optimum performance. Furthermore, the Trench design offers large cell packing density for reduced channel resistance. One significant limitation of Trench designs is the high electric field developing in blocking mode at the bottom corners of the trench gate (11). The U.S. Patent Application No. 2019/0006496 describes an approach for Trench designs by using a floating layer of low P-doped semiconductor material having a maximum peak concentration of $10^{16}/cm^3$ formed adjacently to an enhancement layer, and in between the enhancement layer and the drift layer. This layer fully envelops the corners of the gate trenches, and therefore reduces the electric field intensity at these corners, but also at the junction between the first base layer and the enhancement layer. It is claimed that the enhancement layer can be formed with a peak dopant concentration of $10^{16}/cm^3$ and even up to $10^{17}/cm^3$.

Another approach in prior art combines Planar and Trench cell designs for example the paper "A Trench Planar MOS-FET cell" (Solid State Electronics, V38, No 4, page 821-828, 1995) represents the first publication of a Trench Planar MOS cell design. A similar design was published as a Trench Planar IGBT (IEEE Electron Device Letters, Vol 20, No. 11, November 1999, page 580). The Trench Planar IGBT 300 design shown in FIG. 3 consist only of a planar channel and proposes a trench structure to improve carrier accumulation. The concept proposed the use of shallow trenches for improved blocking capability. The use of enhancement layers has been also proposed in connection with Trench Planar designs. For example, U.S. Pat. No. 9,093,522, describes a Trench Planar design IGBT 400 having a single planar channel (15) and an enhancement layer (17), as shown in FIG. 4A. In the same patent, a further embodiment is described where the channel (15) extends to include a trench section (16) as shown in FIG. 4B. In the prior art concerning the Trench Planar design, the doping of the enhancement layers is strongly limited to small values equal or lower than $2\times10^{15}/cm^3$.

In related prior art, for example U.S. Pat. Nos. 6,380,586 and 8,441,046 describe a trench IGBT 450 where planar channels (15) are orthogonally positioned in relation to trench regions as shown in FIG. 5A for an embodiment having a discontinued trench at the emitter electrode (3). A continuous trench cutting through the emitter electrode (3) was also described. The main feature of this structure is the trench channel (16) which will provide electron injection in both lateral and vertical dimensions at the trench wall as shown in the cross-section along the cutline B-B' as shown in FIG. 5B. Such a power transistor will have different MOS parameters for the vertical and lateral channels, such as the threshold voltage. Furthermore, for the discontinued version, the trench MOS channel (16) at the trench periphery near (10') can become critical due to the sharp trench curvature in that region.

It is thus desirable to find a new MOS cell design concept that can still benefit from the use of enhancement layers, and other design features like field oxides and gate trenches, but without generating high electric fields in critical regions during blocking mode. This will enable a semiconductor device with improved on-state losses in conduction mode, while keeping the breakdown voltage practically unchanged.

SUMMARY

It may be an object of the present invention to provide a cell design for a power semiconductor device offering reduced on-state losses, low drainage of holes, stable gate parameters, improved blocking capability, and good controllability, such as an Insulated Gate Bipolar Transistor (IGBT) with improved electrical characteristics.

These objects may be met by the subject matter of the independent claims. Embodiments of the invention are described with respect to the dependent claims.

The problem is solved by the semiconductor device with the characteristics of claim 1.

The inventive power semiconductor cell design includes layers of different conductivity types, which layers are arranged between an emitter electrode on an emitter side and a collector electrode on a collector side, which can be arranged opposite of the emitter side in the case of a vertical power semiconductor, but can also be arranged on the same emitter side in the case of lateral power semiconductors. The layers comprise, at a minimum:

- a drift layer of a first conductivity type, which is arranged between the emitter side and the collector side, and
- a first base layer of a second conductivity type, which is arranged between the drift layer and the emitter electrode, which first base layer is in direct electrical contact to the emitter electrode, and is structured according to a stripe or cellular layout (i.e. hexagonal, round, square shapes arranged in various configurations), and
- a source region of the first conductivity type, which is arranged at the emitter side embedded into the first base layer and contacts the emitter electrode; wherein, the source region has a higher dopant concentration than the drift layer, and is structured according to the same cellular or stripe layout as the first base layer, and
- a second base layer of the second conductivity type, which is arranged at the emitter side embedded into the first base layer and is situated vertically deeper than the source region and in direct contact with the emitter electrode through a contact opening; wherein, the second base layer has a higher dopant concentration than the first base layer, and can also be structured according to the same cellular layout as the first base layer, and
- a carrier density enhancement layer of the first conductivity type, which is arranged between the drift layer and the first base layer, and completely encloses the first base layer; wherein, the enhancement layer has a higher dopant concentration than the drift layer, but a smaller dopant concentration than the source region, and a fortifying layer of the second conductivity type, which is electrically biased, arranged directly adjacent to the carrier density enhancement layer, and interposed between the enhancement layer, the first insulating layer, and the drift layer; wherein, the peak dopant concentration of the fortifying layer is lower than $10^{17}/cm^3$ and preferably lower than $5 \times 10^{16}/cm^3$, and wherein the maximum depth of the fortifying layer extending in the drift layer can be smaller than the maximum depth of the enhancement layer, and, a first gate electrode, which is arranged on top of the emitter side, which first gate electrode is electrically insulated from the first base layer, the source region, the enhancement layer, and the fortifying layer by a first insulating layer, a carrier flow path is formable under positive gate bias voltage between the emitter electrode, the source region, the first base layer, the enhancement layer, the fortifying layer, and the drift layer, and optionally, a plurality of second gate electrodes embedded in trench recesses, where each of the secondary gate electrodes is electrically insulated from the first base layer, second base layer, source region, enhancement layer, fortifying layer, and the drift layer by a second insulating layer.

In the region between two directly adjacent planar cells, the fortifying layer can be formed as a contiguous layer, or as a combination of the distinct fortifying layers of the two cells. It can be electrically biased through an additional contact that is arranged away from the planar MOS cell, in a region of the semiconductor die (defined as an arrangement of a large number of adjacent planar MOS cells) in a manner that does not interfere significantly with the on-state losses in conduction mode. As such, the fortifying layer is an important structure that shields the electric field from different transistor design features which could result in high local electric fields, and consequently could lower the breakdown voltage capability of the semiconductor device. Typical transistor design features that can lead to increased local electric fields are: the use of enhancement layers, or field oxide regions, or trench gates in their corner regions. The fortifying layer extending between two adjacent planar cells is also a key feature in reducing the stored charge between the cells. The input capacitance of the semiconductor device is reduced, leading to improved and controllable switching behaviour during turn-on and short circuit conditions.

The new design offers a wide range of advantages both in terms of performance (reduced losses, improved controllability and reliability), and ease of processing, with the potential of applying enhancement layers, while maintaining or even increasing the breakdown voltage capability.

The inventive design can be applied to both IGBTs and MOSFETs based on silicon or wide bandgap materials such as silicon carbide (SiC). In particular, the use of a highly doped region of first conductivity type, manufactured, as per the embodiments of this invention, adjacent to the MOS channel, can be very beneficial in reducing the voltage drop in conduction mode for SiC MOSFET semiconductors.

Those skilled in the art will recognize additional features and advantages upon reading the following detailed description and upon viewing the accompanying drawings.

BRIEF DESCRIPTION OF THE DRAWINGS

The embodiments of the invention will be explained in more detail in the following text with reference to the attached drawings, in which.

Figure 1A:
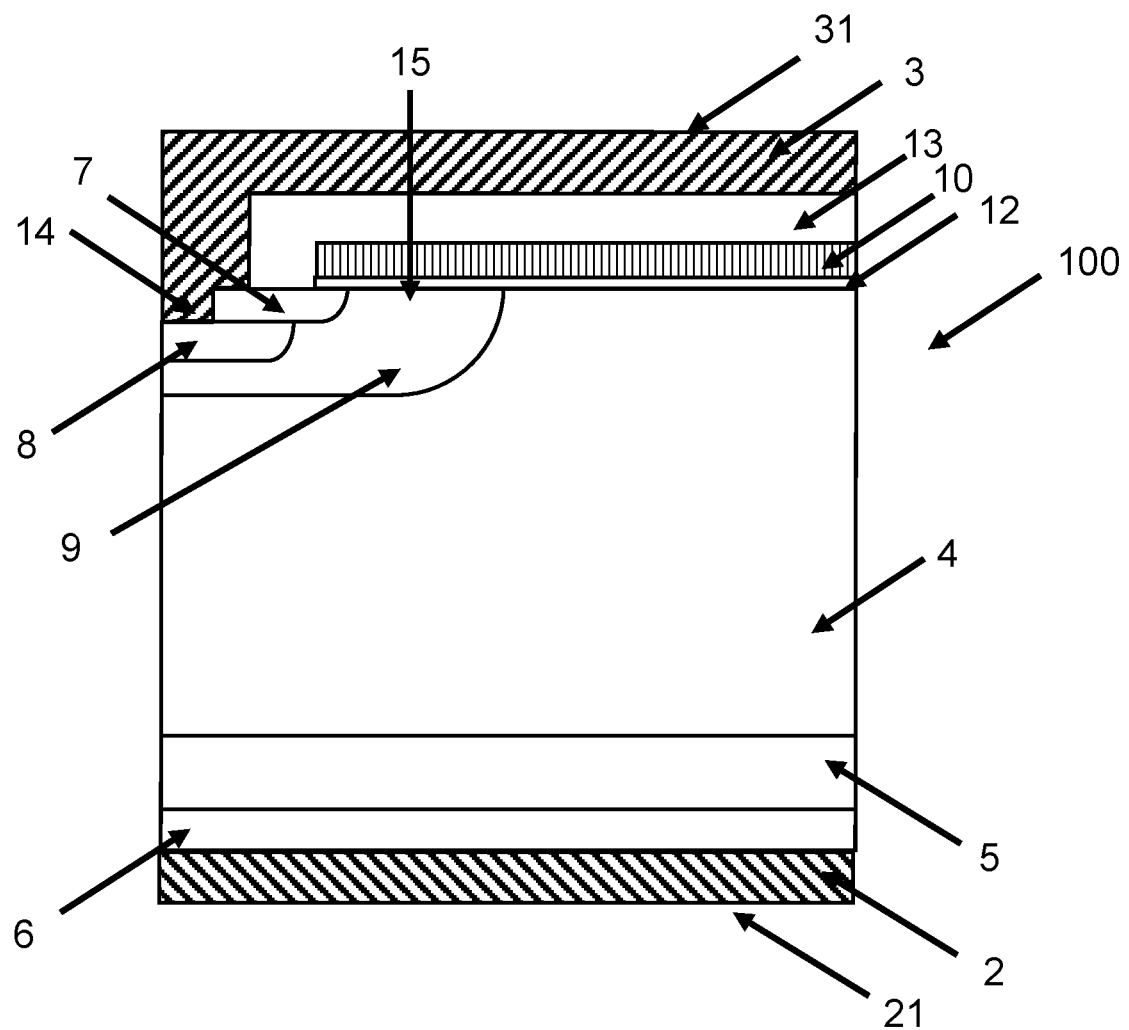
FIG. 1A: shows the cross section of a Planar MOS IGBT structure (prior art).

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure (s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e. g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

In this specification, N-doped is referred to as first conductivity type while P-doped is referred to as second conductivity type. Alternatively, the semiconductor devices can be formed with opposite doping relations so that the first conductivity type can be P-doped and the second conductivity type can be N-doped.

Specific embodiments described in this specification pertain to, without being limited thereto, insulated gate bipolar semiconductor devices.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e. g. "between" versus "directly between", "adjacent" versus "directly adjacent," etc.).

Figure 6A:
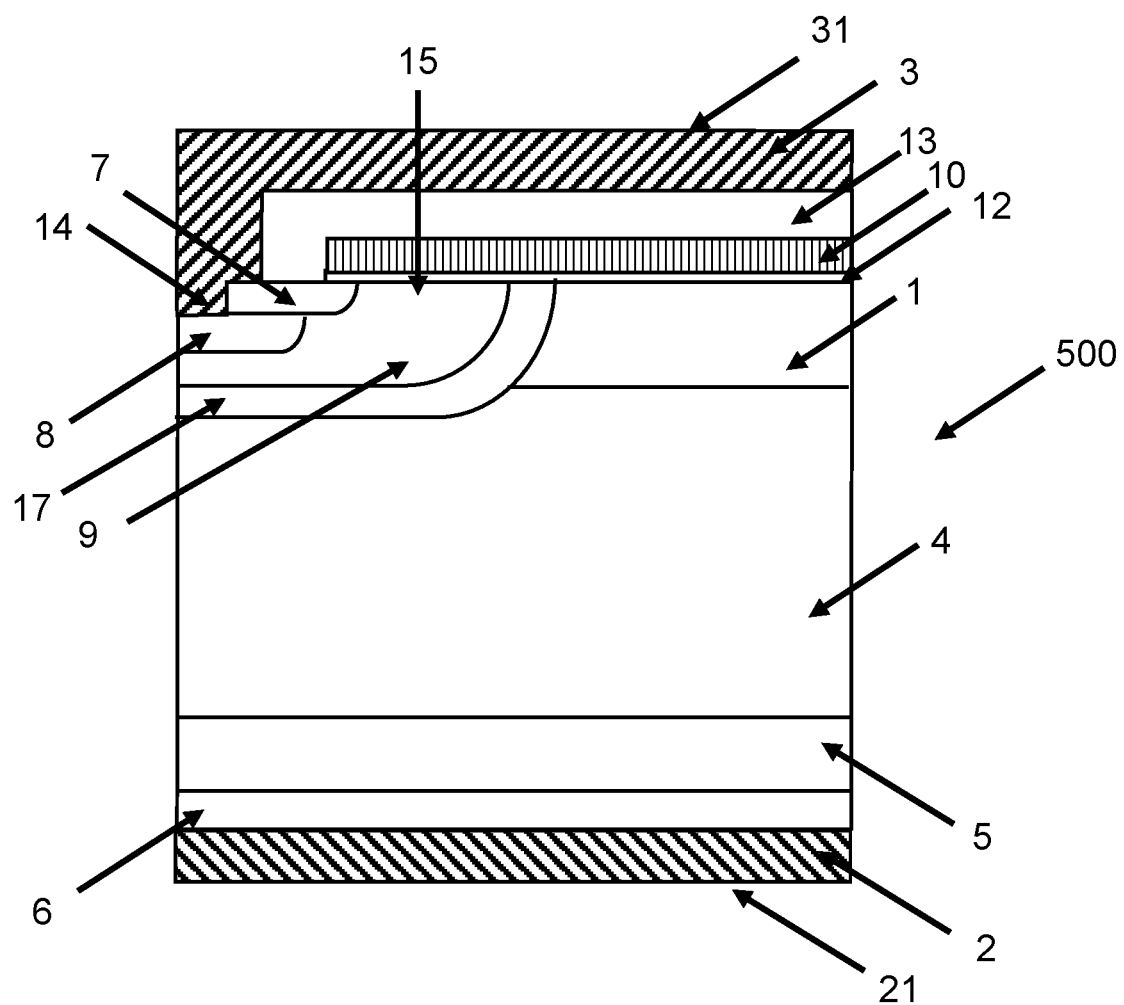
FIG. 6A: shows a cross section of a first exemplary embodiment of a Fortified Enhanced Planar IGBT cell according to the invention.

The first embodiment is shown in FIG. 6A, depicted as the planar IGBT 500 consisting of the following layers arranged between an emitter electrode (3) on an emitter side (31) and a collector electrode (2) on a collector side (21), arranged opposite of the emitter side:

a drift layer (4) of a first conductivity type, which is arranged between the emitter side (31) and the collector side (21), and a first base layer (9) of a second conductivity type, which is arranged on the top of the emitter side (31) between the drift layer (4) and the emitter electrode (3), which first base layer (9) is structured according to a stripe or cell layout, and a source region (7) of the first conductivity type, which is arranged at the emitter side (31) embedded into the first base layer (9) and in direct contact with the emitter electrode (3), which source region (7) has a higher dopant concentration than the drift layer (4), and is structured according to the same stripe or cell layout as the first base layer (9), and a second base layer (8) of the second conductivity type, which is arranged at the top of the emitter side (31) embedded into the first base layer (9) and is situated vertically deeper than the source region (7) and in direct contact with the emitter electrode (3), which second base layer (8) has a higher dopant concentration than the first base layer (9), and can also be structured according to the same stripe or cell layout as the first base layer (9), and a carrier density enhancement layer (17) of the first conductivity type, which is arranged between the drift layer (4) and the first base layer (9), and completely encloses the first base layer (9), which enhancement layer (17) has a higher dopant concentration than the drift layer (4), but a smaller dopant concentration than the source region (7), and a fortifying layer (1) of the second conductivity type, arranged directly adjacent to the carrier density enhancement layer (17), and formed in between the enhancement layer (17), the first insulating layer (12), and the drift layer (4); wherein, the fortifying layer can be biased through an electrical contact at the semiconductor die level, and a first gate electrode (10), which is arranged on top of the emitter side (31), which first gate electrode is electrically insulated from the first base layer (9), the source region (7), the enhancement layer (17), and the fortifying layer (1), by a first insulating layer (12), a carrier flow path is formable in conduction mode between the emitter electrode (3), the source region (7), the MOS channel (15), the enhancement layer (17), the fortifying layer (1), and the drift layer (4).

The fortifying layer (1) is formed with a maximum depth that is smaller than the maximum depth of the enhancement layer (17), when referenced to the position of the emitter side (31). Thus, the fortifying layer (1) only partially surrounds the enhancement layer (17). That is to say that the fortifying layer (1) covers only a portion of the interface between the enhancement layer (17) and the drift layer (4). For example, the enhancement layer (17) regions directly under the first base layer (9) are in direct contact with the drift layer (4).

The dopant concentration of the fortifying layer (1) is selected so that the maximum peak dopant concentration value remains low, preferably below $5 \times 10^{16}/cm^3$. This corresponds to a sheet density of carrier concentration substantially lower than $1 \times 10^{12}/cm^2$ within the fortifying layer (1) on a plane whose distance from the surface on the emitter side (31) is substantially constant. Due to the presence of the fortifying layer (1), the high electric fields at the junction between layers (9) and (17) are significantly reduced and the breakdown voltage capability of the device is recovered or even improved compared to the device without the fortifying layer (1).

The fortifying layer (1) can be biased through an additional electrical contact. This contact can be arranged further away from the transistor cell level, in a region of the semiconductor die (defined as an arrangement of a large number of adjacent transistor cells formed on the same drift layer (4) and operating in parallel) that does not significantly impact the on-state losses in conduction mode.

Figure 1B:
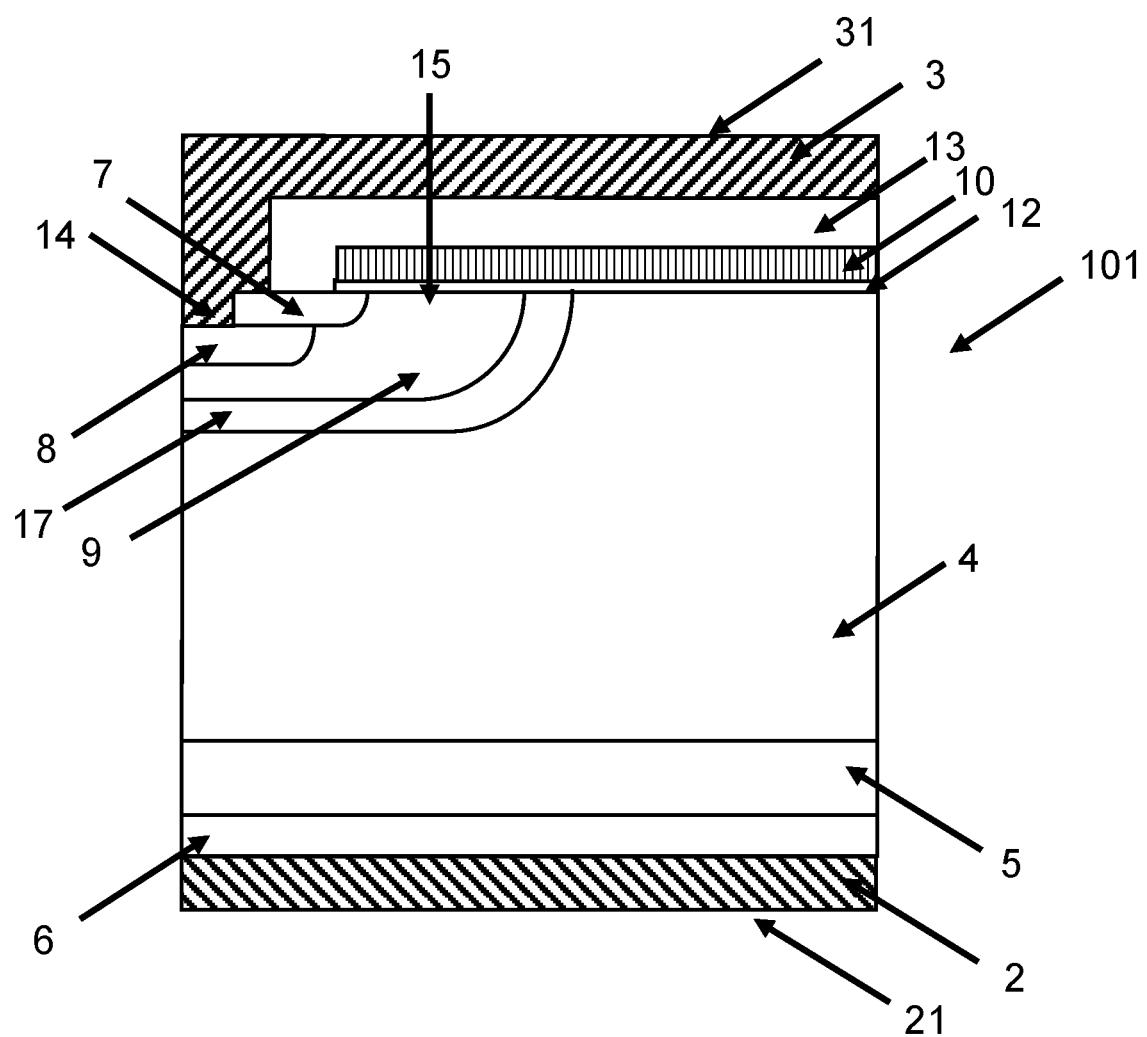
FIG. 1B: shows the cross section of an Enhanced Planar MOS IGBT structure (prior art).
Figure 1C:
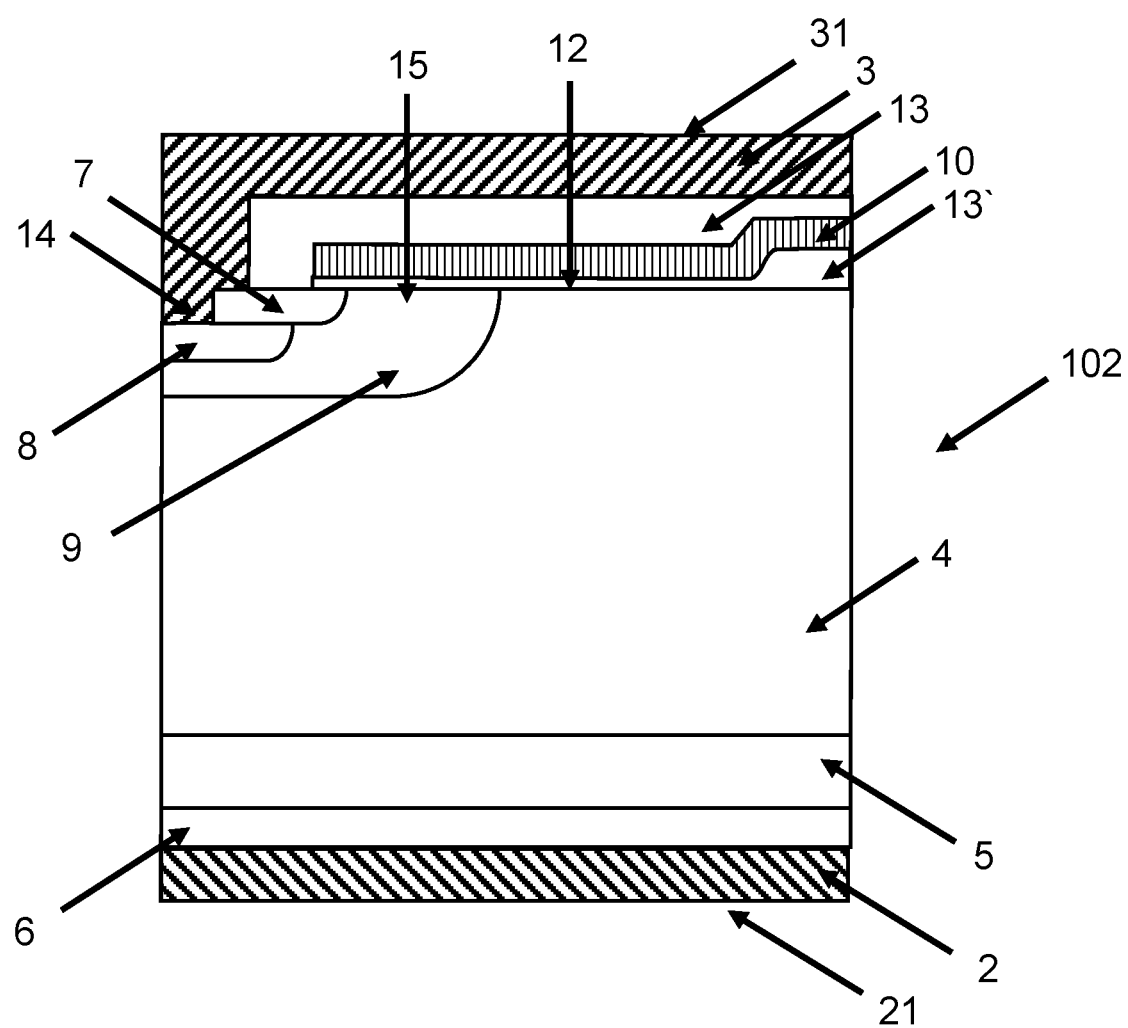
FIG. 1C: shows the cross section of a Planar MOS IGBT structure with field oxide (prior art).
Figure 2A:
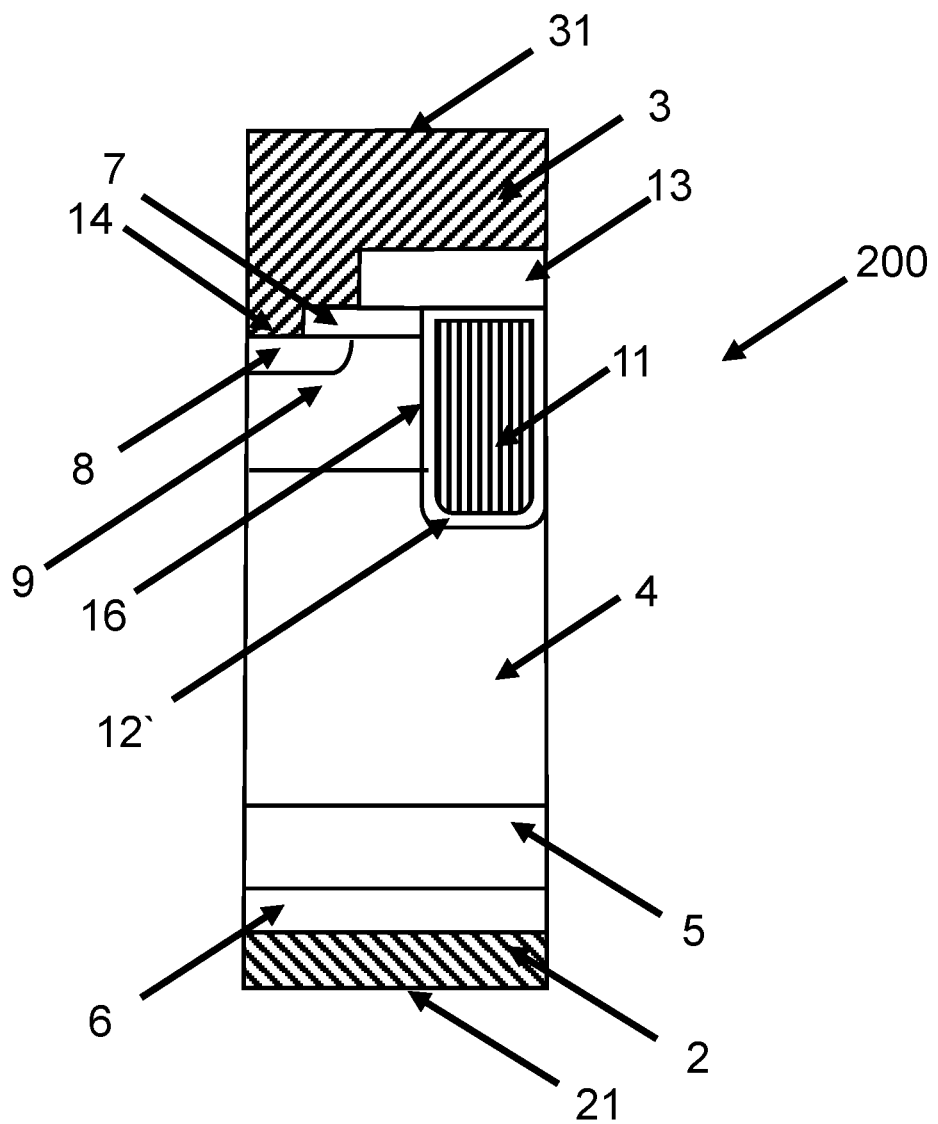
FIG. 2A: shows the cross section of a Trench MOS IGBT structure (prior art).
Figure 2B:
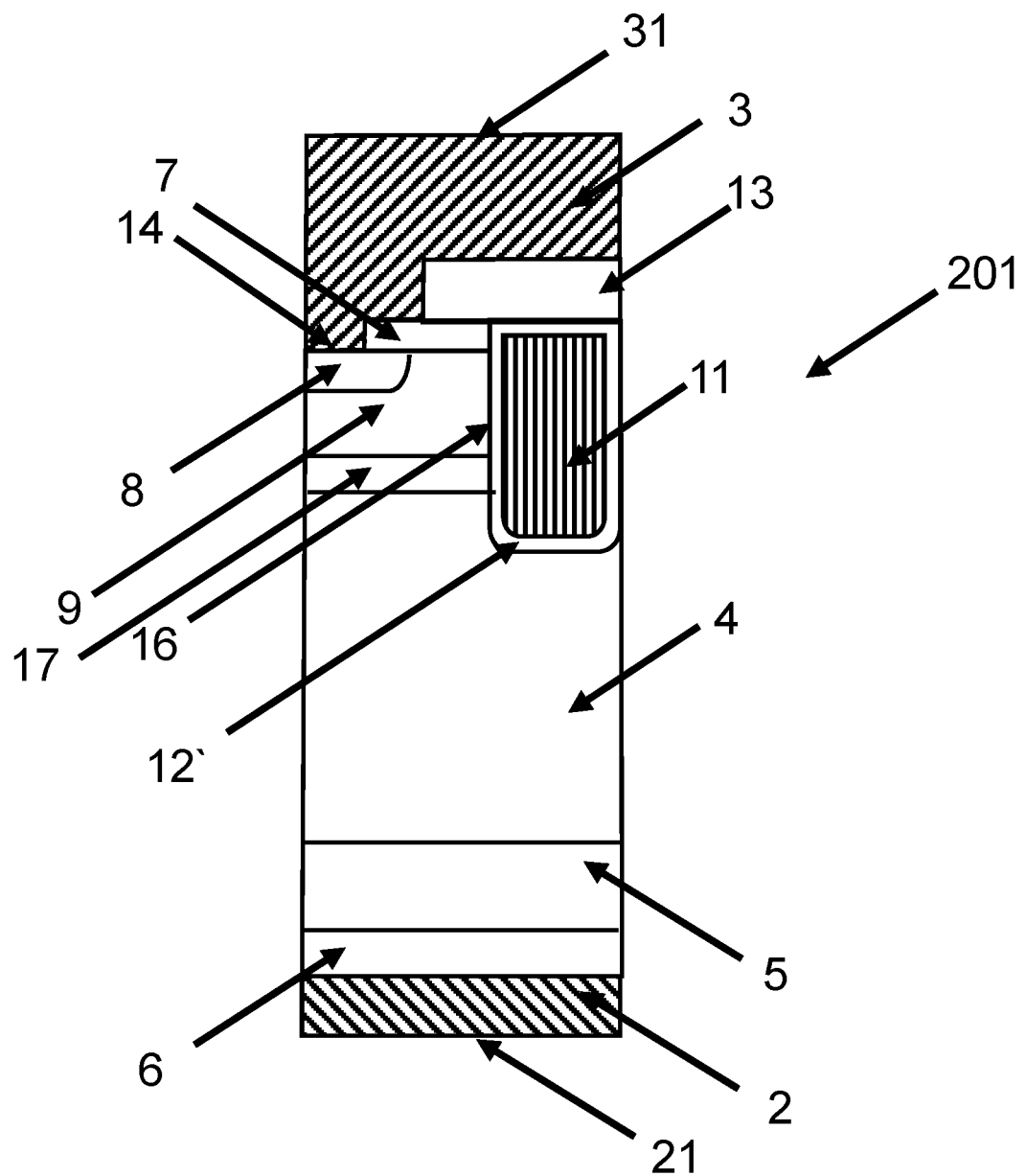
FIG. 2B: shows the cross section of an Enhanced Trench MOS IGBT structure (prior art).
Figure 3:
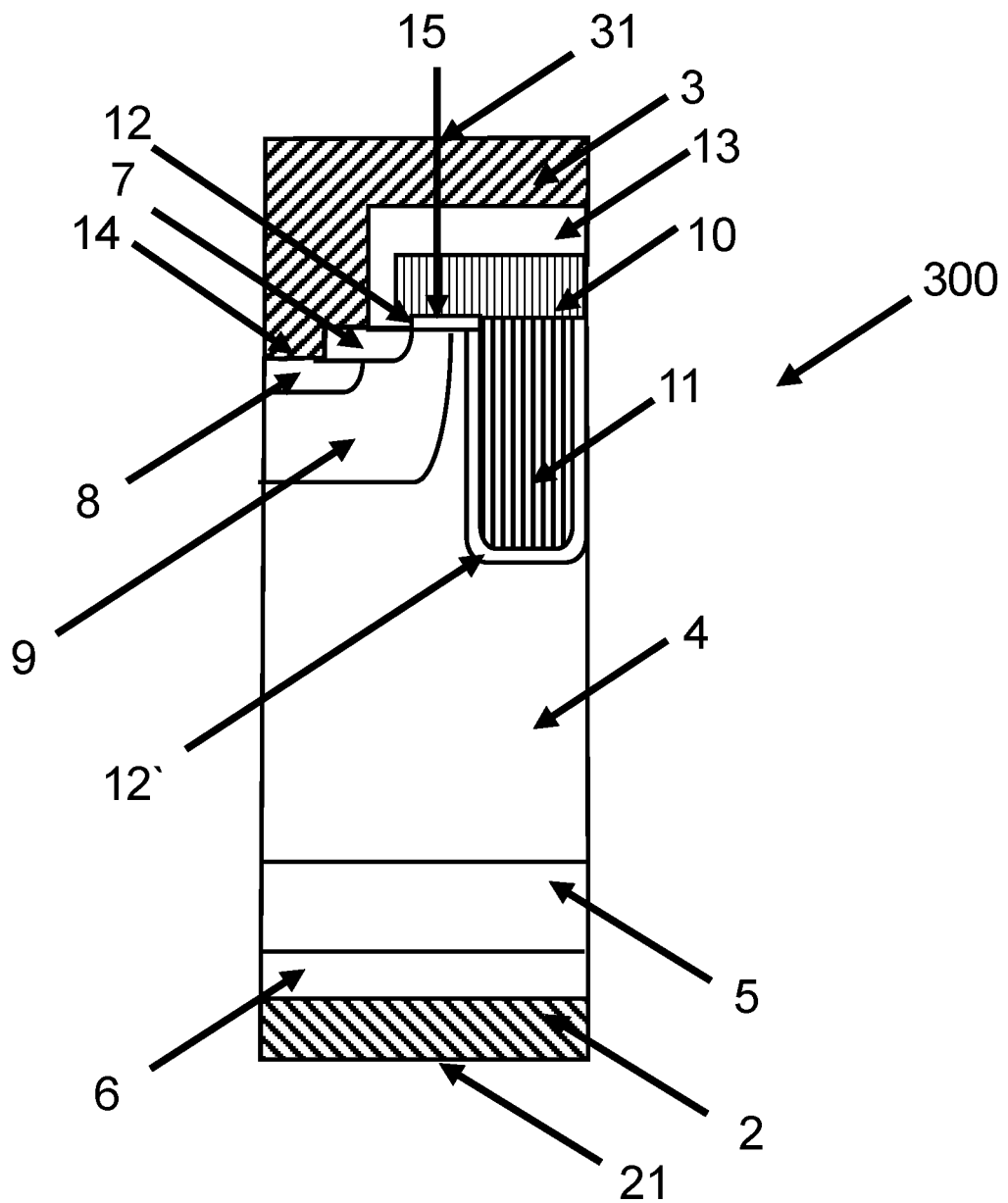
FIG. 3: shows the cross section of a Trench Planar MOS IGBT structure with single channel (prior art).
Figure 4A:
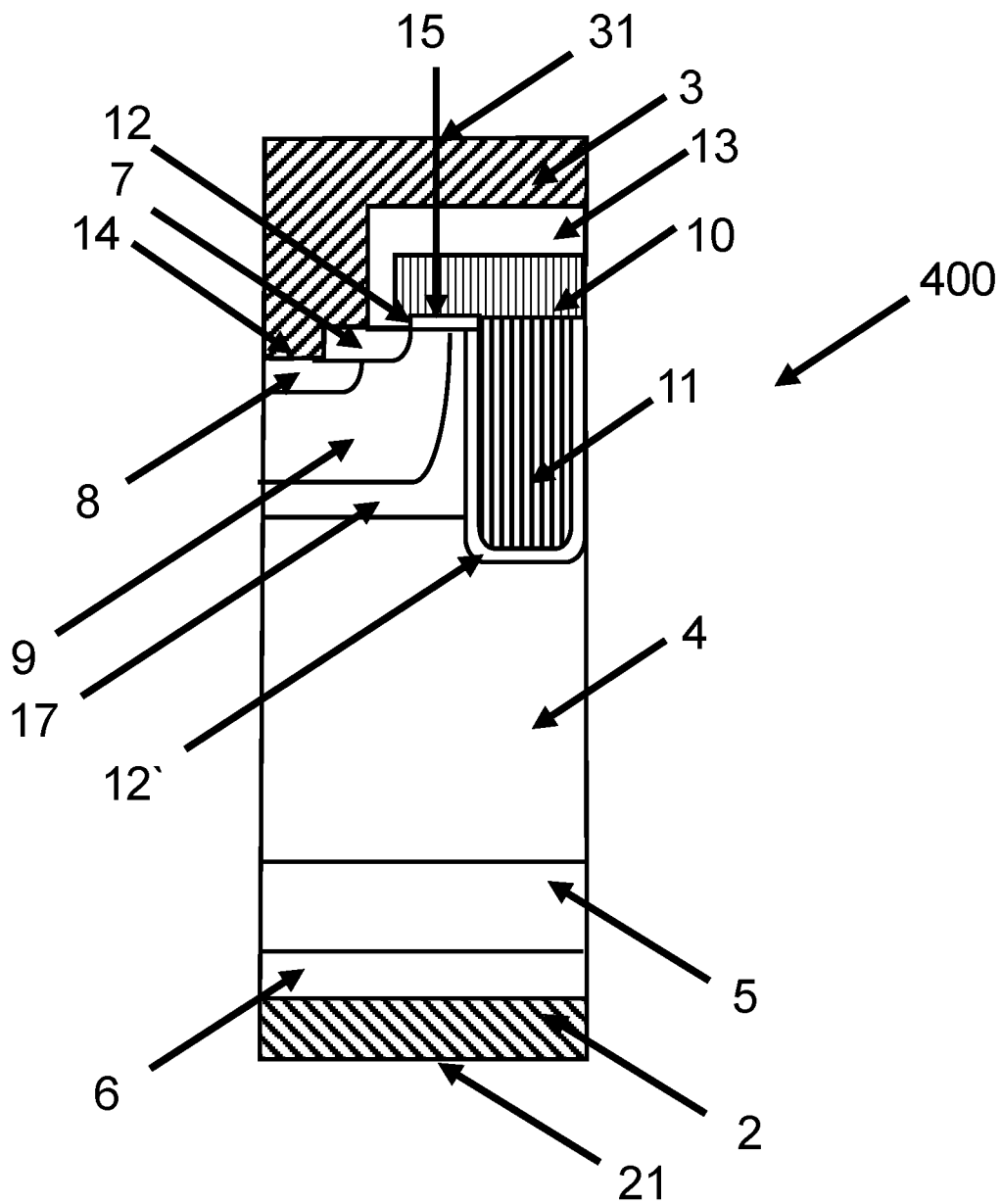
FIG. 4A: shows the cross section of a Trench Planar MOS IGBT structure with enhancement layer and only the planar MOS channel (prior art).
Figure 4B:
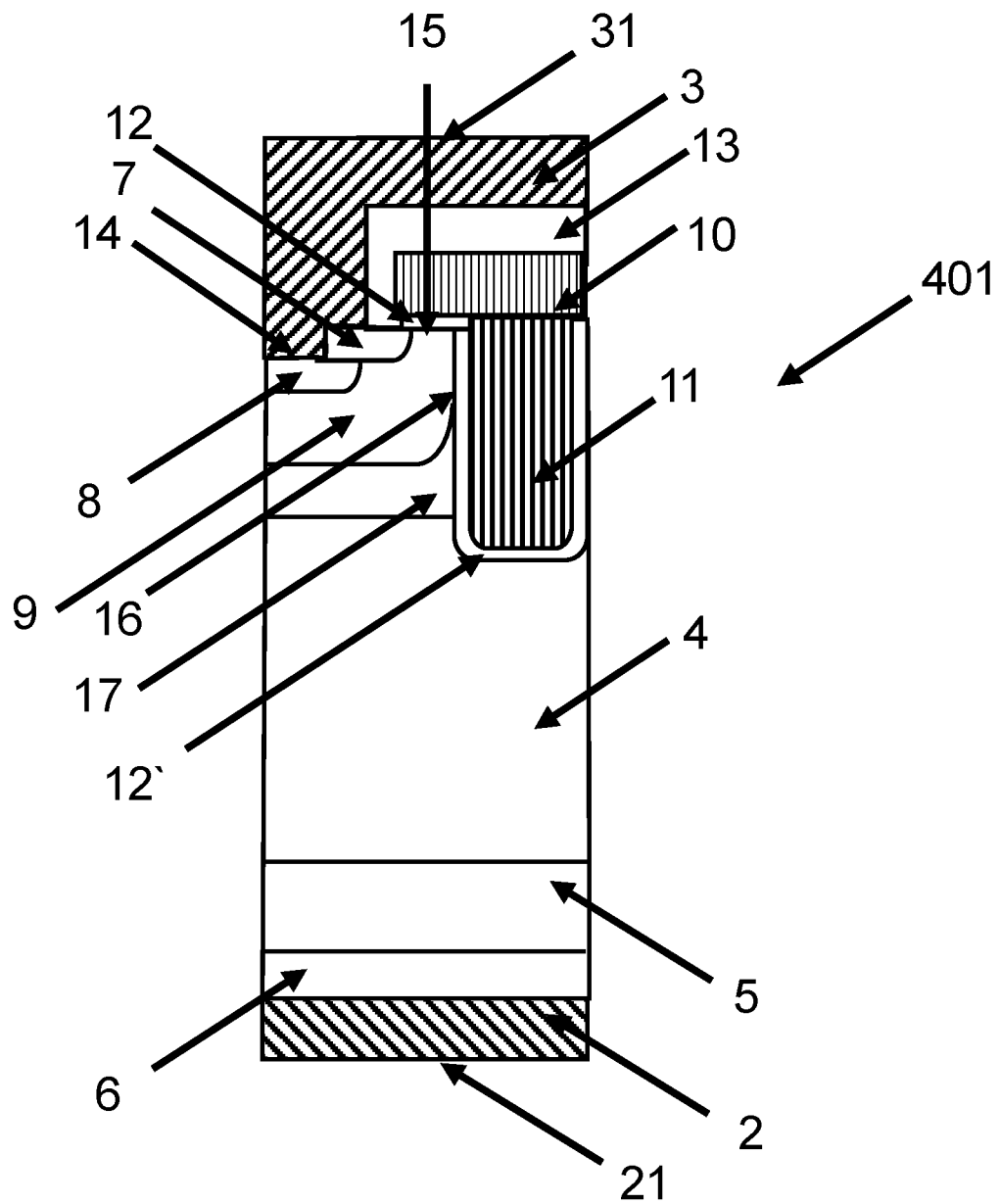
FIG. 4B: shows the cross section of a Trench Planar MOS IGBT structure with enhancement layer and both planar and vertical MOS channels (prior art).
Figure 5A:
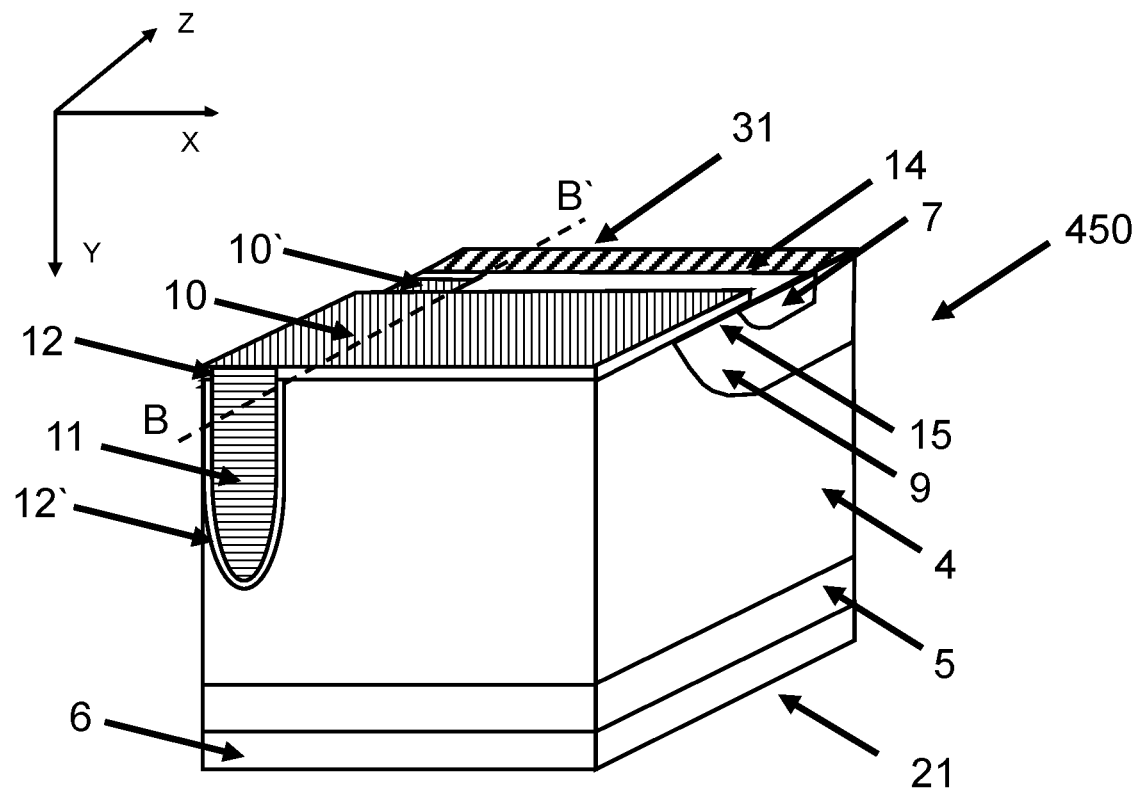
FIG. 5A: shows a 3D view of Trench Planar MOS IGBT structure with trench gate electrodes orthogonal to the planar cells (prior art).
Figure 5B:
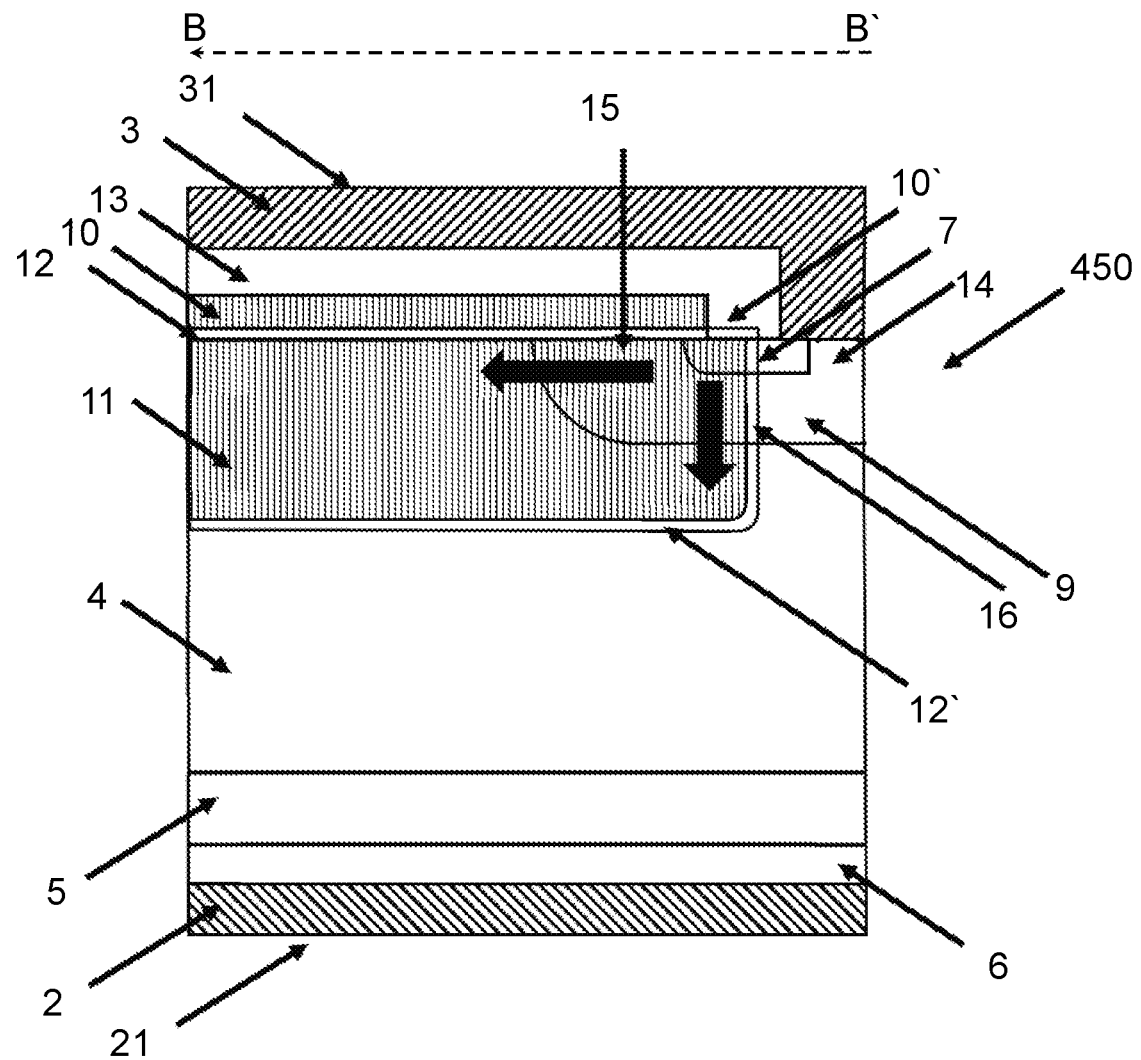
FIG. 5B: shows the cross section along the cut line B-B' in FIG. 5A. (prior art).

With reference to FIG. 1B depicting the prior art without the fortifying layer (1), it is worth observing that in conduction mode, the enhancement layer (17) will increase the concentration of minority charge carriers (i.e. holes) accumulating in the drift layer (4) away from layer (17) under the gate electrode (10). Whereas, when the fortifying layer (1) is formed as in FIG. 6A, the concentration of minority charge carriers will be much lower in the same region. This reduces the input capacitance of the device and improves the controllability of the semiconductor device during turn-off/on or in short-circuit conditions.

Figure 6B:
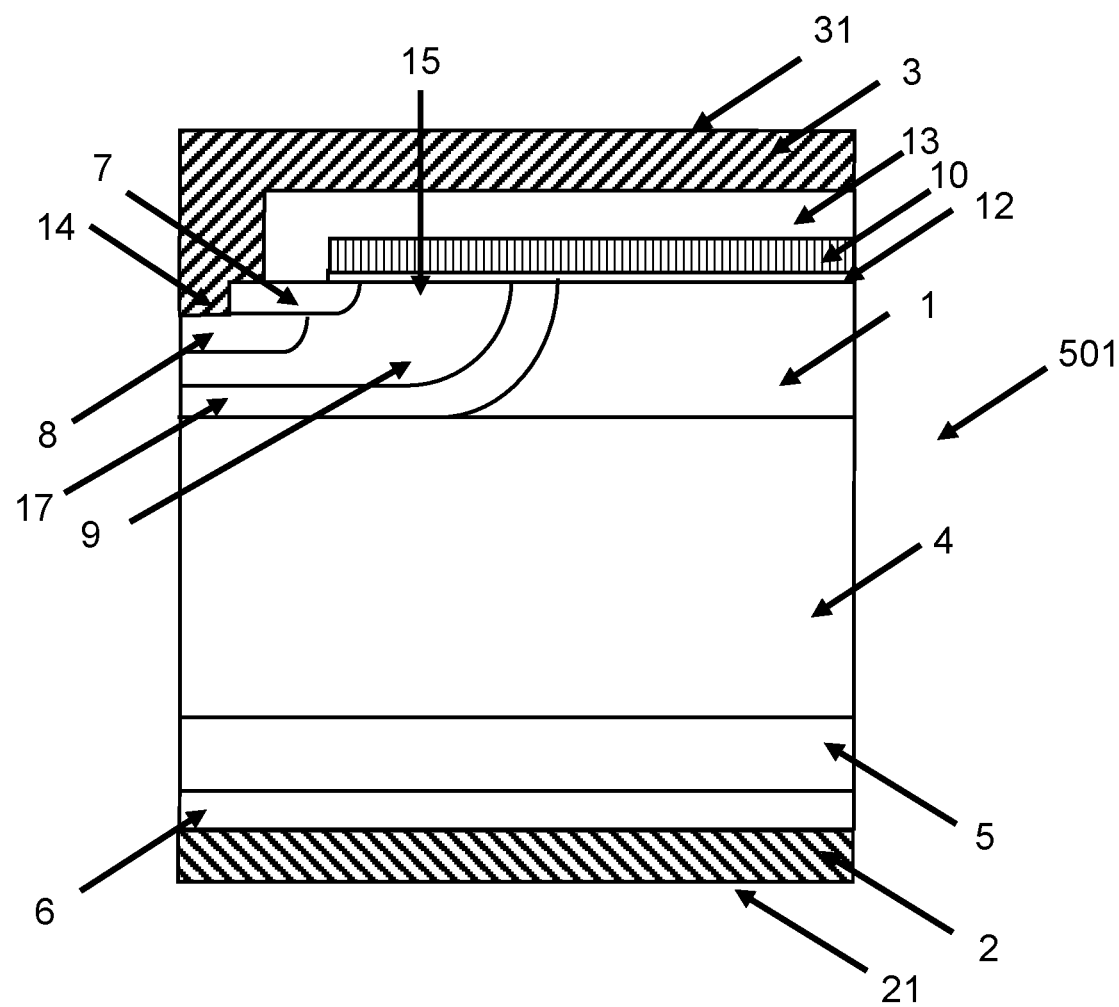
FIG. 6B: shows a cross section of a second exemplary embodiment of a Fortified Enhanced Planar IGBT cell according to the invention.
Figure 6C:
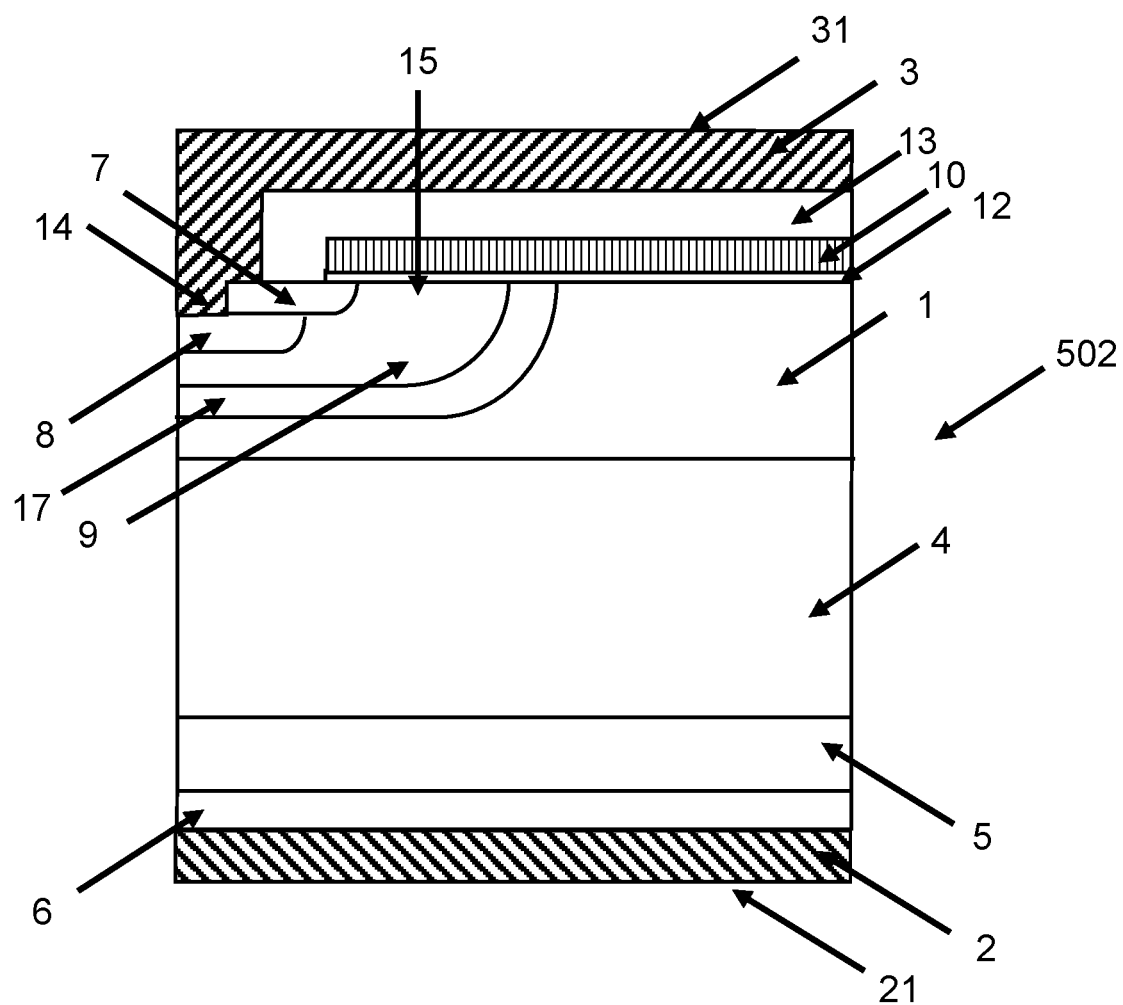
FIG. 6C: shows a cross section of a third exemplary embodiment of a Fortified Enhanced Planar IGBT cell according to the invention.

However, in a similar planar MOS cell, the fortifying layer (1) can also be formed to have a maximum depth equal or larger than the maximum depth of the enhancement layer (17) when referenced to the position of the emitter side (31). These embodiments are shown in FIGS. 6B and 6C. Specifically, in FIG. 6C the fortifying layer (1) is completely surrounding the enhancement layer (14), i.e. there is no more direct contact between the enhancement layer (17) and the drift layer (4) (could still be formed in the third dimension if needed). The dopant concentration of the fortifying layer (1) is selected similarly to the first embodiment, so that the maximum peak dopant concentration value remains low, preferably below $5 \times 10^{16}/cm^3$. Because the dopant concentration in the fortifying layer (1) is lowered, this layer does not interfere with the flow of electrons in conduction mode. More specifically, when a voltage bias is applied on the gate electrode (10), an inverted MOS channel (15) is formed in the regions of the first base layer (9) and the fortifying layer (1) directly adjacent to the insulating layer (12), and an accumulation layer is formed in the enhancement layer (17) in the region directly adjacent to the insulating layer (12). However, other regions of the fortifying layer (1) away from the insulating layer (12) will not be inverted, for example the portion of the layer (1) located below the first base layer (9) and the enhancement layer (14) in FIG. 6C. Nonetheless, the inventors confirmed by simulations that electrons will pass through the non-inverted regions of the fortifying layer (1), and will follow a carrier path that includes: the source regions (7), the inverted MOS channel (15), the enhancement layer (17), the non-inverted regions of the fortifying layer (1), and the drift layer (4). In addition, because the dopant concentration of the fortifying layer (1) is relatively low, there is no risk of latching up parasitic thyristor structures inside the device structure in conduction mode.

A further benefit of using a fortifying layer (1) in conjunction with the enhancement layer (17) is related to the increased controllability of the device during turn-off/on operation or in short-circuit conditions. By adjusting the peak dopant concentration of the fortifying layer (1), the amount of excess minority carriers (i.e. holes) is reduced in device, and in some instances the turn-off/on process can be slowed down for better controllability.

Figure 7:
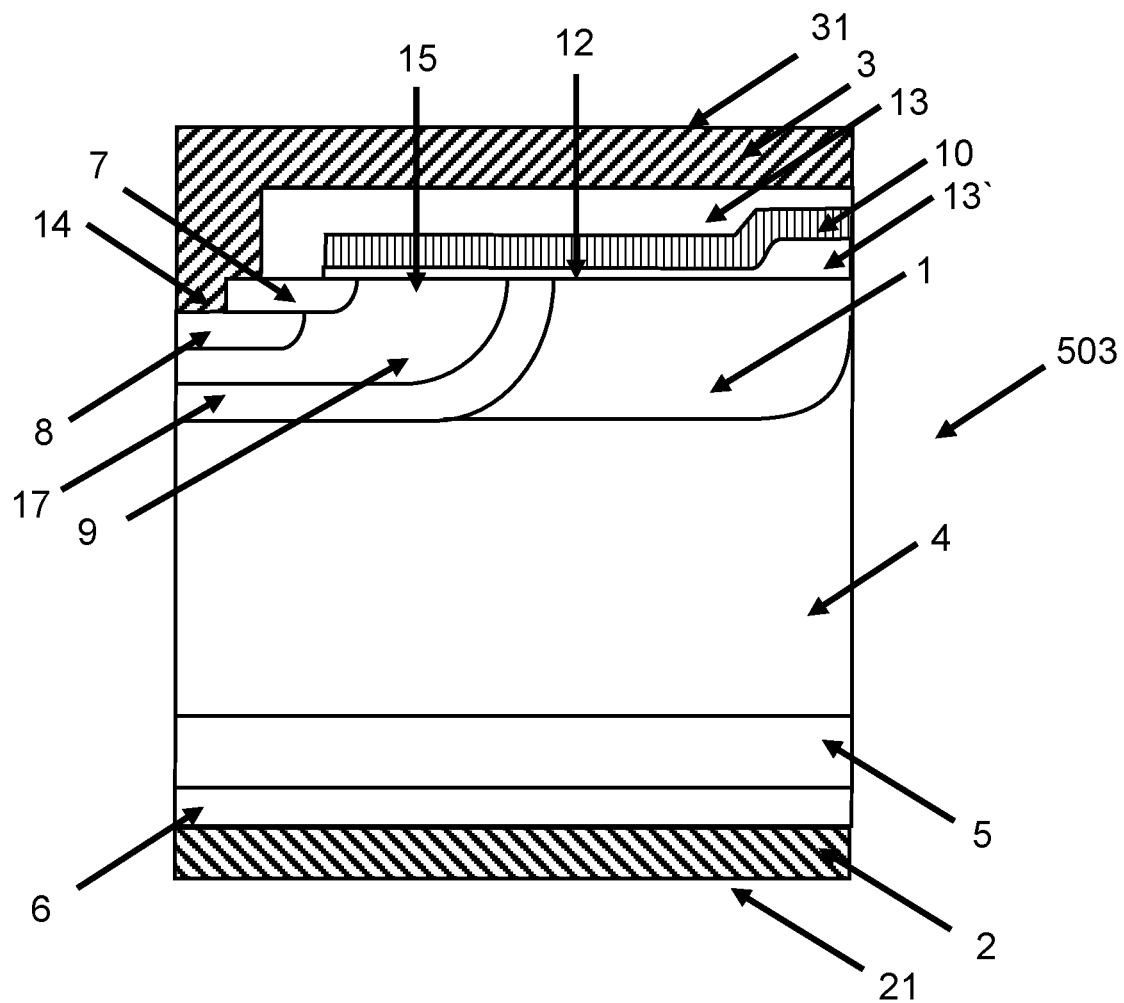
FIG. 7: shows a cross section of a fourth exemplary embodiment of a Fortified Enhanced Planar IGBT cell with field oxide, according to the invention.

In a fourth embodiment, shown in FIG. 7, a field oxide layer (13') thicker than the first insulating layer (12) is used to improve the device controllability especially in the areas between the IGBT planar cells. Without the fortifying layer (1), there will be a high electric field developing in blocking mode under the field oxide layer (13'). The fortifying layer (1) helps in this case by alleviating this high peak electric field. In between two directly adjacent IGBT cells, the fortifying layer (1) could be formed as a contiguous layer, or as a combination of the distinct fortifying layers of the two transistor cells. In either case, the fortifying layers (1) will extend under the edge of the field oxide, where the high electric field is located.

Figure 8A:
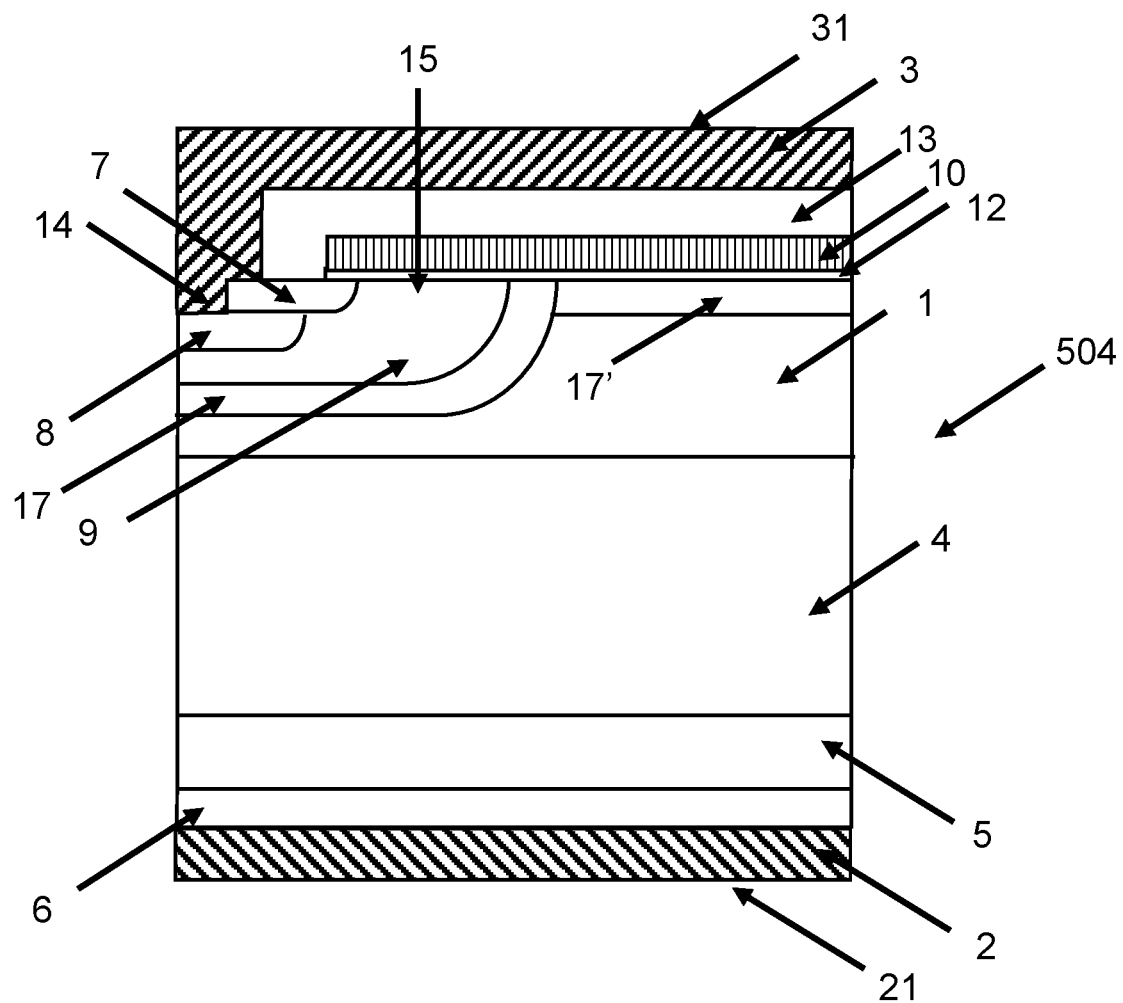
FIG. 8A: shows a cross section of a fifth exemplary embodiment of a Fortified Enhanced Planar IGBT cell according to the invention.
Figure 8B:
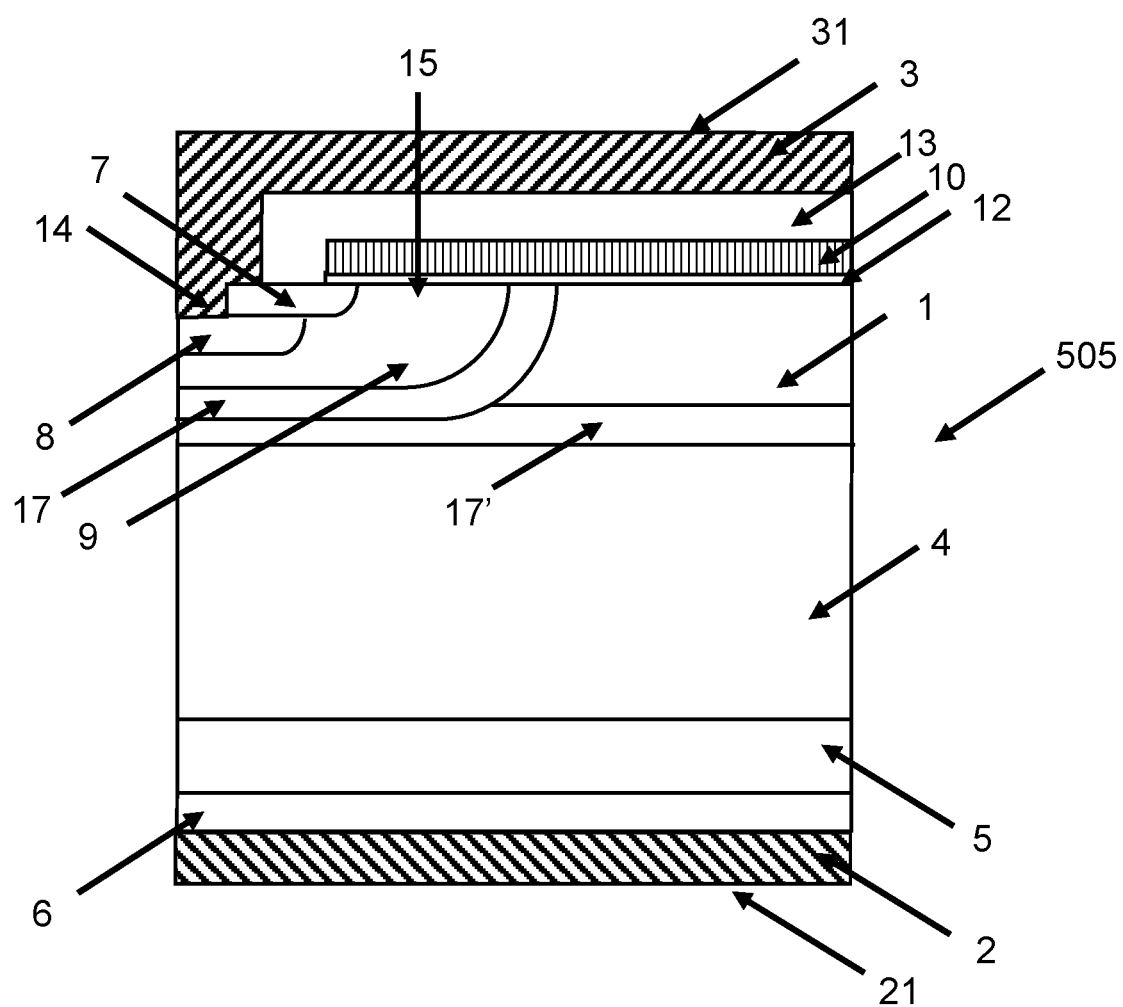
FIG. 8B: shows a cross section of a sixth exemplary embodiment of a Fortified Enhanced Planar IGBT cell according to the invention.

The fifth and sixth embodiments are depicted in FIGS. 8A and 8B, respectively. In these embodiments, the fortifying layer (1) is not directly adjacent to the first insulating layer (12) or the drift layer (4), but is separated via an additional layer (17') of first or second conductivity type. As established, the low dopant concentration of the fortifying layer (1) will not impact the flow of electrons in the device in conduction mode. However, the presence of the fortifying layer (1) will help reducing the high electric fields that could be generated in the structure by the additional layer (17'). In one embodiment, the layer (17') can be of first conductivity type, and directly adjacent to the insulating layer (12) as shown in FIG. 8A. If the layer (17') is highly doped compared to the drift layer, the flow of electrons exiting the planar MOS channel (15) in conduction mode, will be able to spread horizontally over a larger distance. In this case, layer (17') can act as a "current spread layer", and thus reduce the JFET effect typical for Planar designs.

The following embodiments include structures comprising also one or multiple second gate electrodes which are embedded in trench recesses. The inventive planar semiconductor cell design integrates a Trench gate (as second gate electrodes) into a Planar MOS cell in order to gain the advantages of both designs in terms of reduced on-state losses, low drainage of holes, stable gate parameters, improved blocking and good controllability. The second gate electrodes (11) are formed in a manner such that the longitudinal direction of their trench recesses can be any angle between 0° to 90° (selected depending on the design) with respect to the longitudinal direction of the source regions (7), of the first base layer (9), and of the first gate electrode (10) in a top/plane view of the emitter side (31) (denoted in this patent application as "the longitudinal direction of the MOS transistor cell"). For example, when the angle is chosen to be 0°, the trench recesses are formed parallel with the longitudinal direction of the MOS transistor cell on the surface of the emitter side (31). When the angle is selected to be 90°, the second gate electrodes (11) will be formed orthogonally to the longitudinal direction of the MOS transistor cell on the surface of the emitter side (31).

Figure 9A:
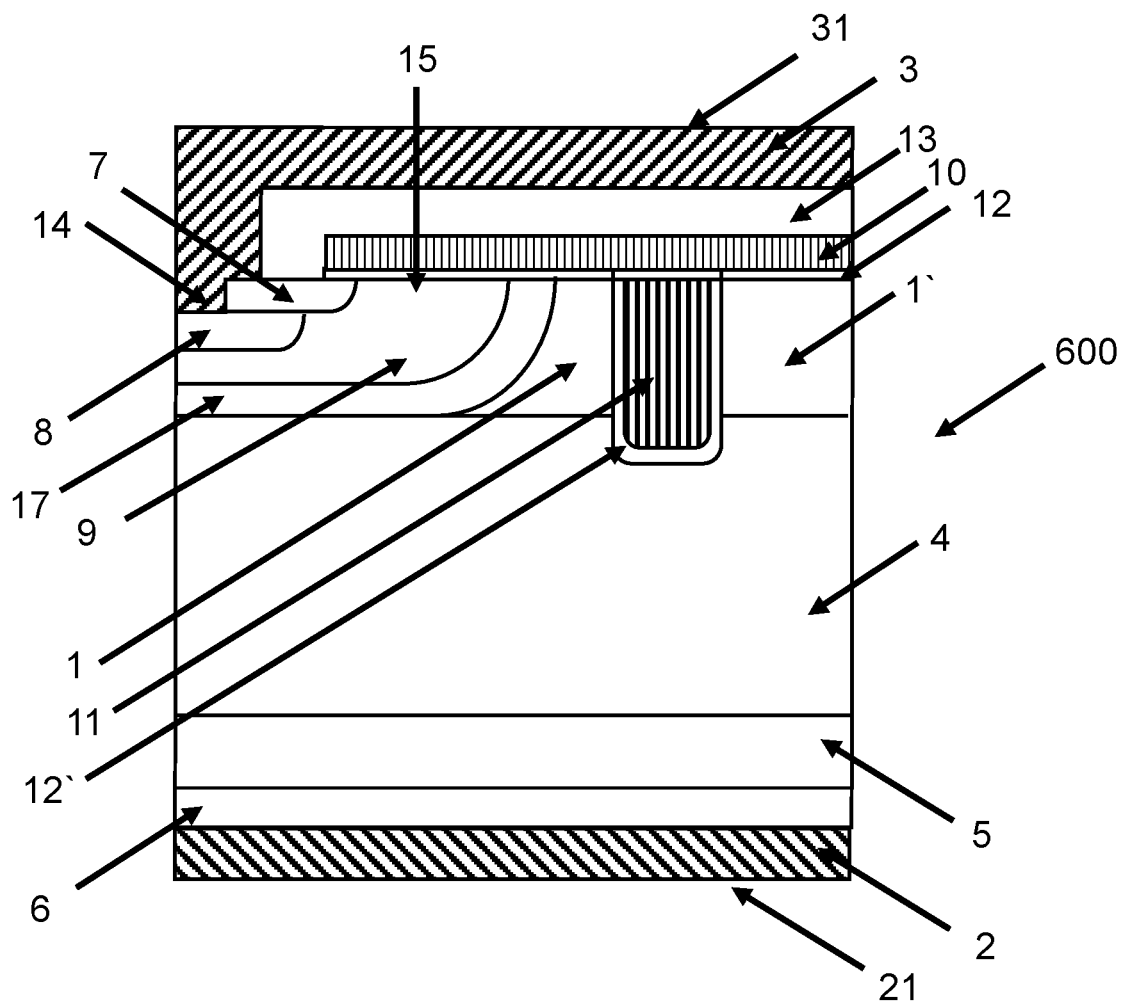
FIG. 9A: shows a cross section of a seventh exemplary embodiment of a Fortified Enhanced Planar Trench IGBT cell according to the invention.
Figure 9B:
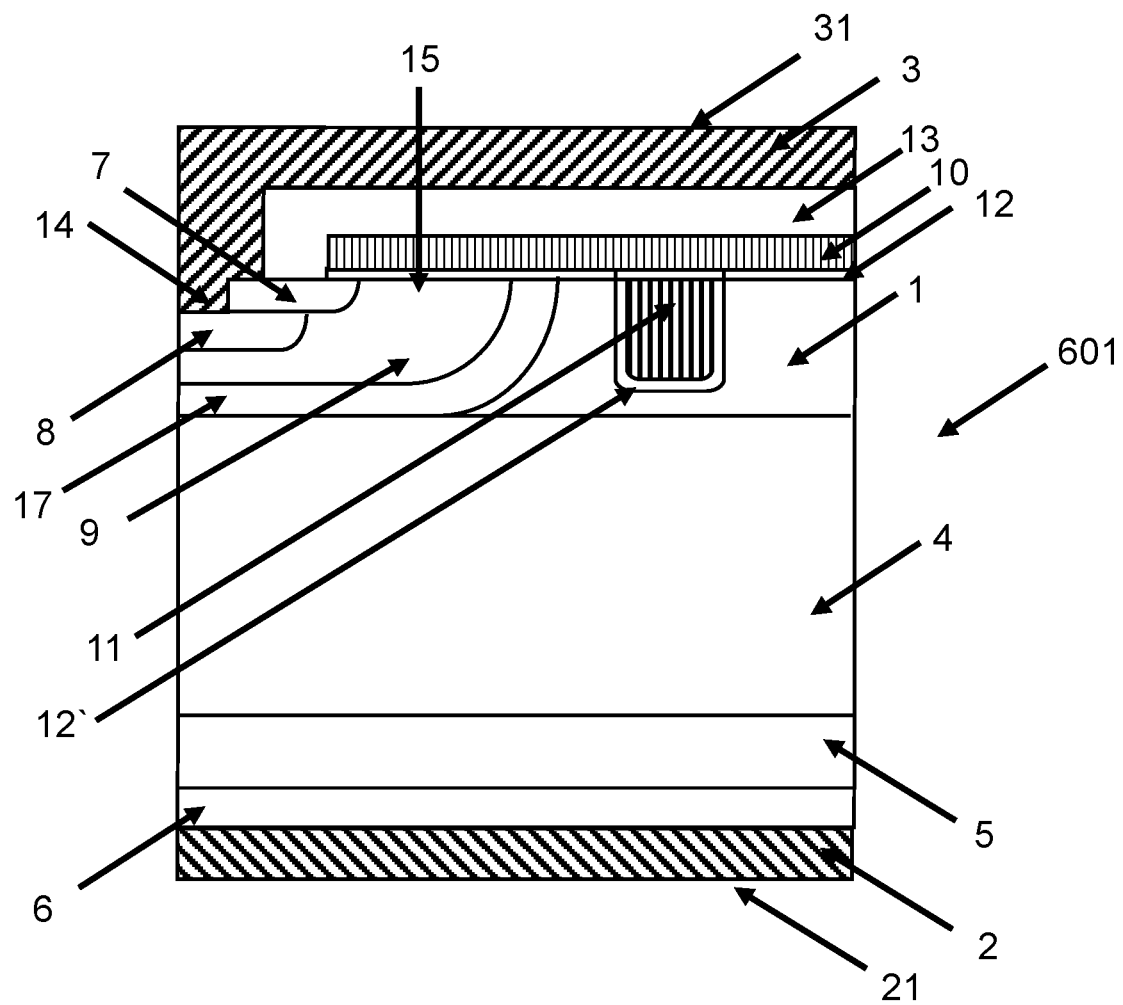
FIG. 9B: shows a cross section of an eight exemplary embodiment of a Fortified Enhanced Planar Trench IGBT cell according to the invention.

The seventh and eight embodiments shown in FIGS. 9A and 9B refer to the use of the fortifying layer (1) in trench planar structures with a single MOS channel (15), where the trench recesses of the second gate electrodes (11) are formed as stripes parallel to the longitudinal direction of the MOS cell as described in the above paragraph. More specifically, in the IGBT 600 depicted in FIG. 9A, the trench recesses of the second gate electrodes (11) extend deeper in the drift layer than the fortifying layer (1), thus effectively defining two separate fortifying layers (1) and (1'). The layer (1') can be a contiguous layer or can be formed by merging additional lateral spreading profiles of separate and adjacent fortifying layers. In the IGBT 601 depicted in FIG. 9B, the trench recesses of the second gate electrodes (11) are formed shallower than the fortifying layer (1), and are thus completely surrounded by the layer (1). In both FIGS. 9A and 9B, the maximum depth of the fortifying layer in the drift layer can also be larger than the maximum depth of the enhancement layer.

Figure 10A:
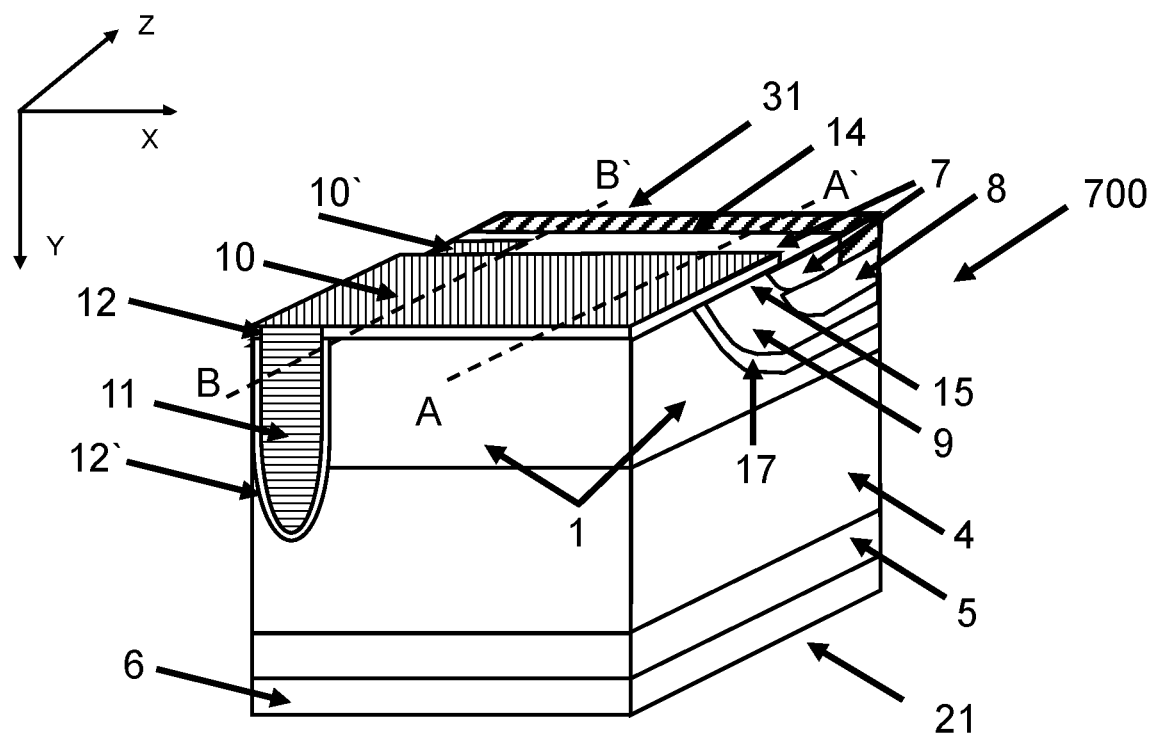
FIG. 10A: shows a 3D view of a ninth exemplary embodiment of a Fortified Enhanced Planar Trench IGBT cell according to the invention.
Figure 10B:
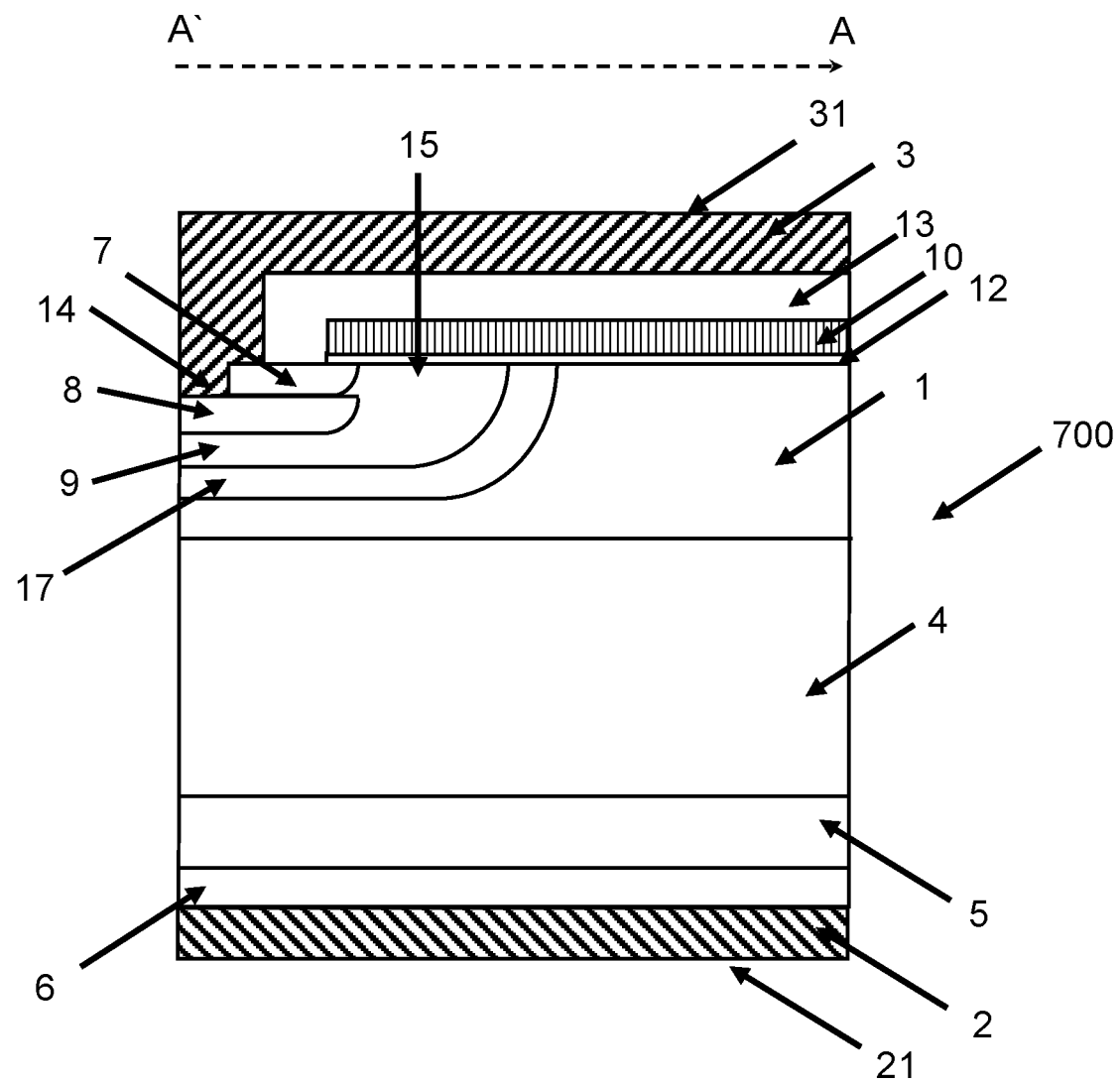
FIG. 10B: shows a cross section of the ninth exemplary embodiment of a Fortified Enhanced Planar Trench IGBT cell according to the invention, along the cut line A-A' in FIG. 10A.
Figure 11A:
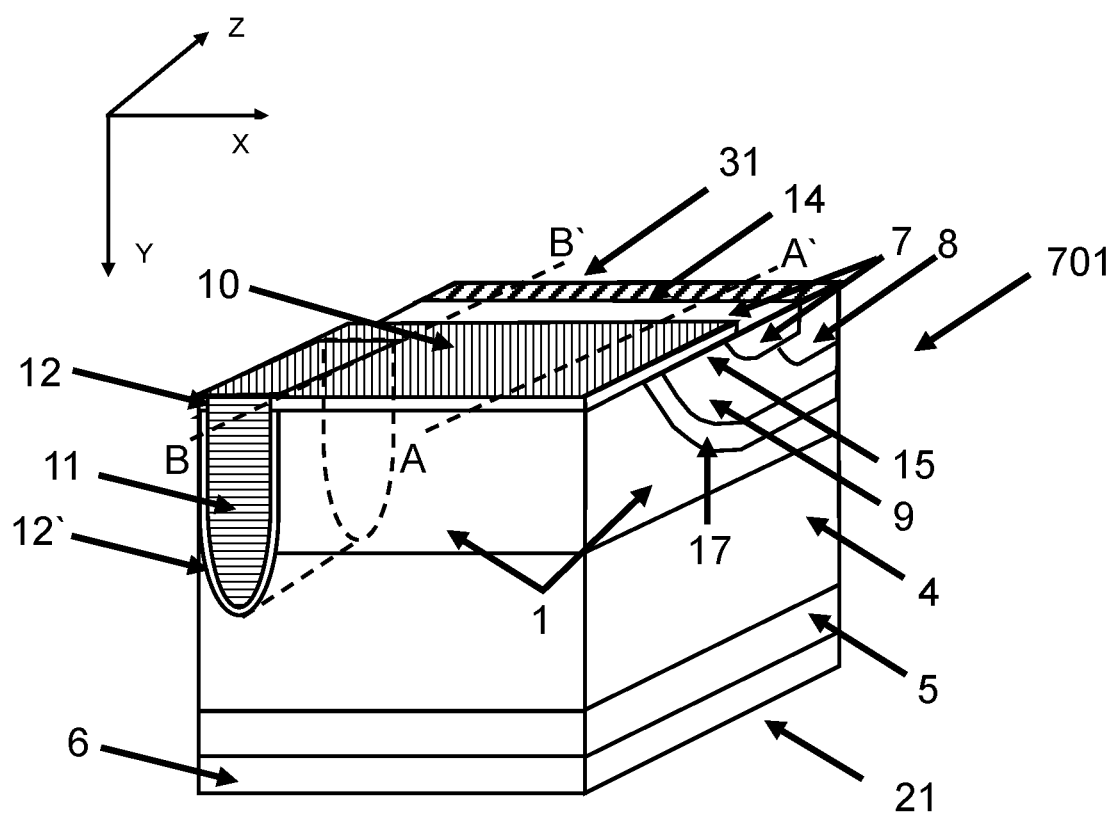
FIG. 11A: shows a 3D view of a tenth exemplary embodiment of a Fortified Enhanced Planar Trench IGBT cell according to the invention.

FIGS. 10A and 11A depict the ninth and tenth embodiments, referring to the case where the trench recesses of the second gate electrodes (11) are formed orthogonally (at an angle of 90°) to the longitudinal direction of the MOS cell as described above. These embodiments are more easily understood in a three-dimensional description. In FIG. 10A, the orthogonal second gate electrodes (11) are shown to reach into the source region (7). The pitch of the trench recesses in the direction "X" can be very narrow, even below without having the challenge of structuring source regions or base layers in between trenches. In addition, the source region (7) and the second base layer (8) have the same lateral spreading in the direction "Z", i.e. the lateral edges of the corresponding doping profiles are at the same distance at a point furthest away from the contact opening (14). This can be better observed in FIG. 10B, which represents the cross section of the IGBT 700 along the cut line A-A'. The cross section represents the planar part of the IGBT 700 and is very similar to the IGBT 502 depicted in the FIG. 6C, with the exception of the alignment between the lateral edges of the source region (7) and of the second layer (8).

Figure 10C:
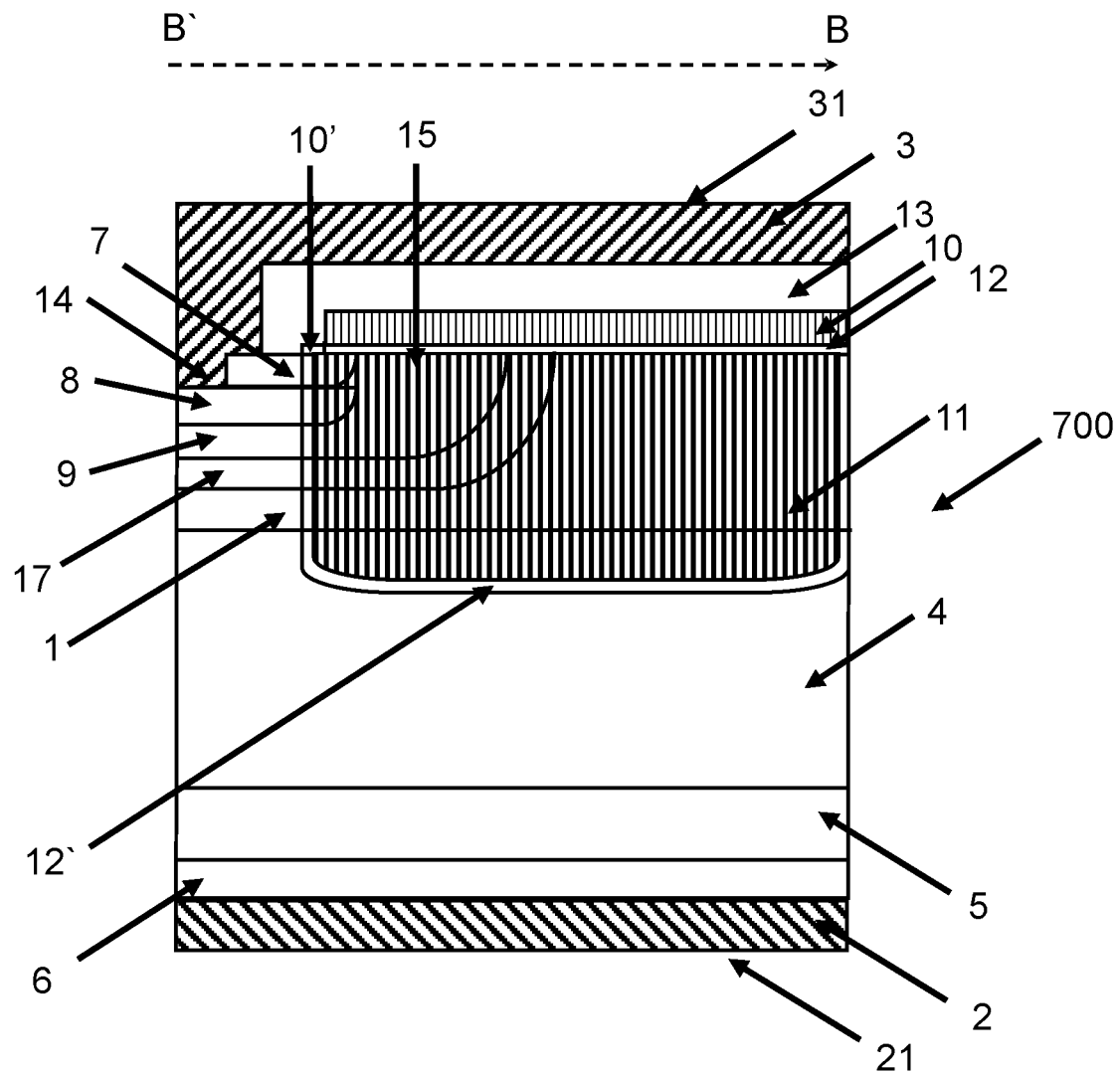
FIG. 10C: shows a cross section of the ninth exemplary embodiment of a Fortified Enhanced Planar Trench IGBT cell according to the invention, along the cut line B-B' in FIG. 10A.

The cross section along the cut line B-B' in FIG. 10A (along the vertical wall of the second gate trench) is depicted in FIG. 10C. In this case, a vertical channel through the highly doped second base layer (8) is not formable in conduction mode. The electrons will flow in conduction mode horizontally in the MOS channel (15), and then towards the drift layer (4), along the vertical walls of the trench recesses. As discussed previously, because the fortifying layer (1) is low doped, it does not prevent the flow of electrons.

Figure 11B:
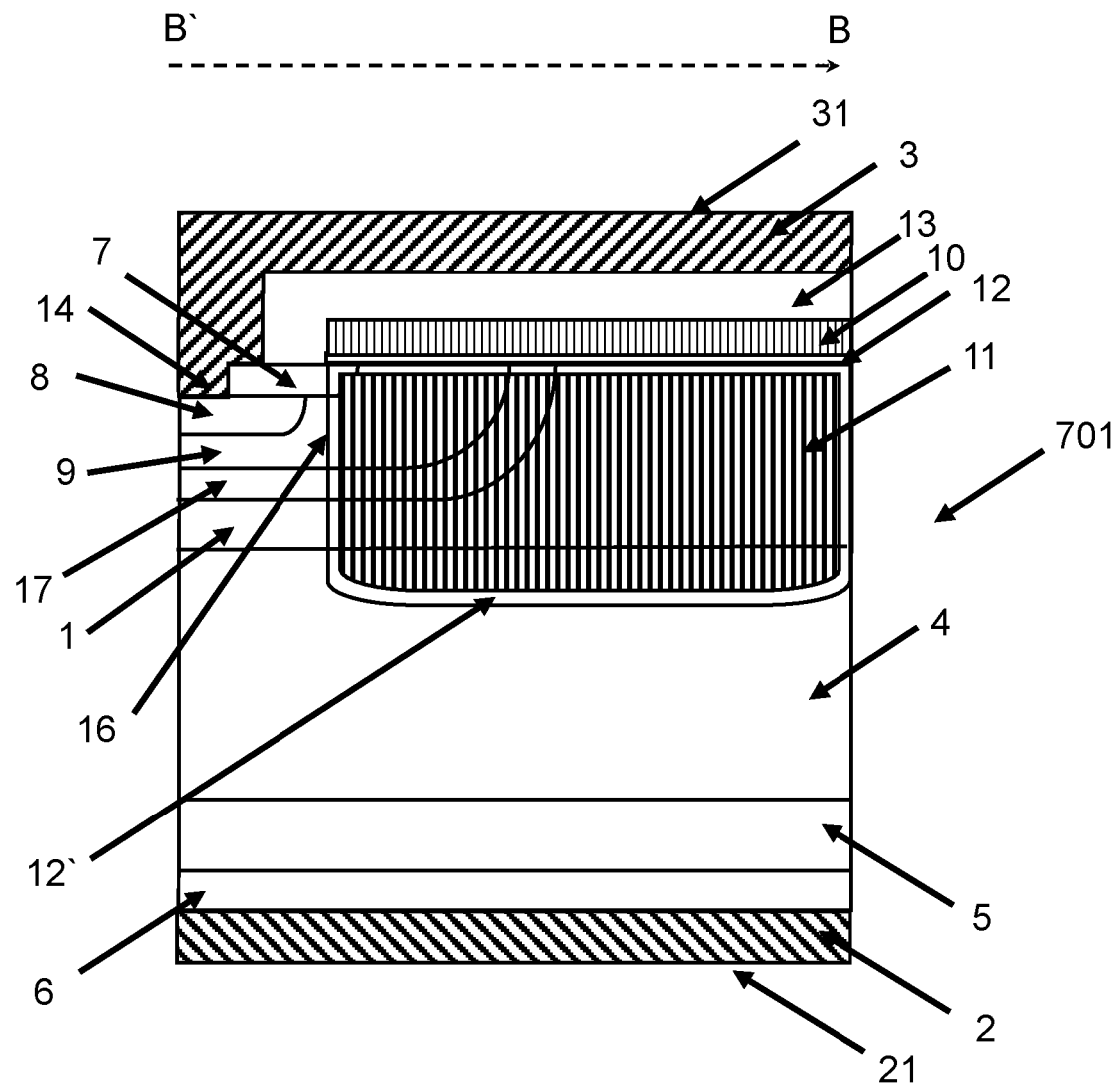
FIG. 11B: shows a cross section of the tenth exemplary embodiment of a Fortified Enhanced Planar Trench IGBT cell according to the invention, along the cut line B-B' in FIG. 11A.
Figure 11C:
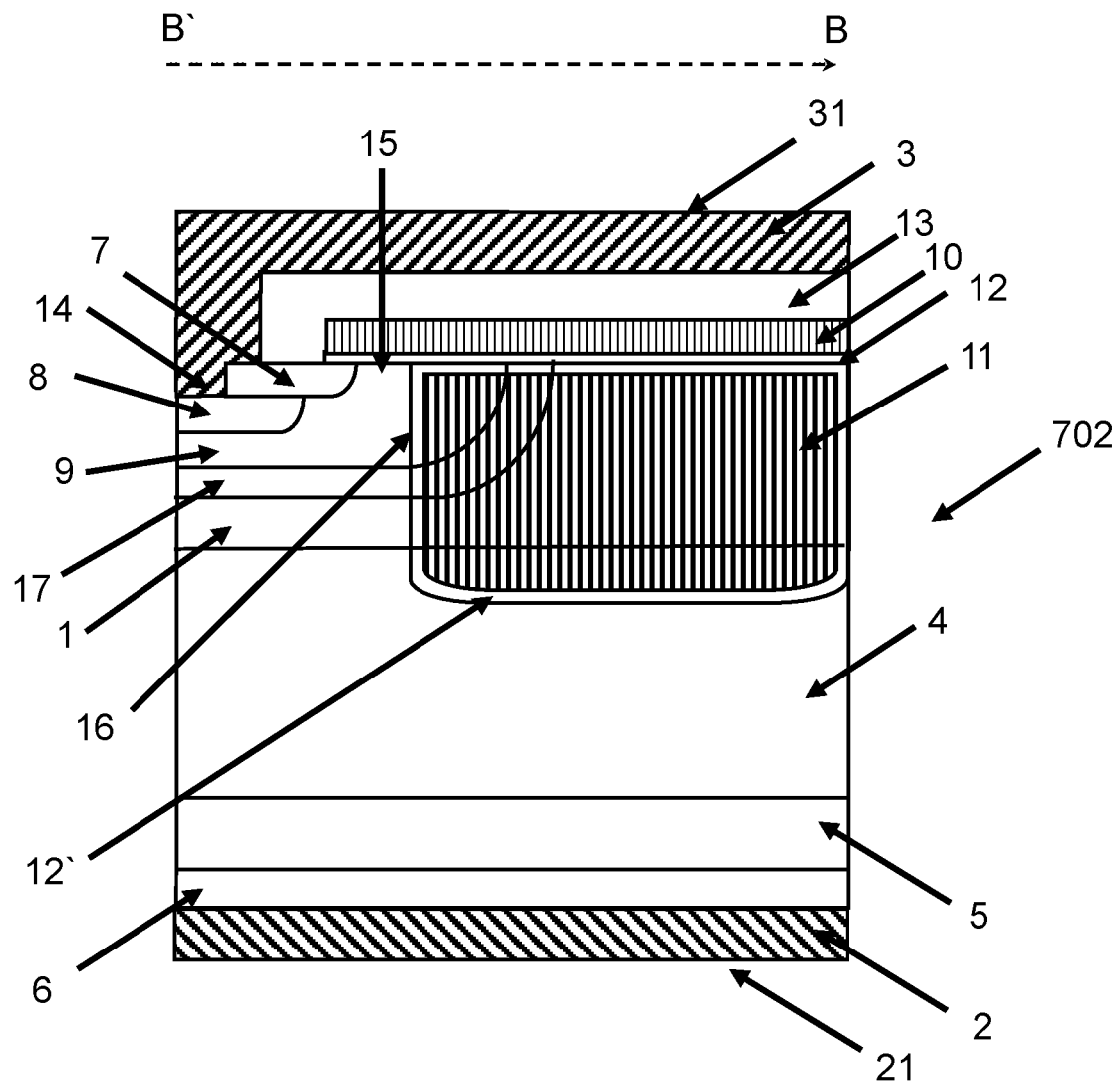
FIG. 11C: shows a cross section of an eleventh exemplary embodiment of a Fortified Planar Trench IGBT cell according to the invention.

FIG. 11A depicts the tenth embodiment, as the IGBT structure 701, where the main modification to the structure IGBT 700 is related to the difference of alignment between the lateral edge of the source region (7) and that of the second base layer (8). This can be better seen in FIG. 11B, which shows the cross section of the IGBT 701 along the cut line B-B' in FIG. 11A. In this case, the second gate electrodes (11) reach into the source region (7), and a vertical MOS channel (16) is formable in conduction mode, by inverting the regions of the first base layer (9) directly adjacent to the insulating layer (12'). It is also possible to have a similar arrangement three dimensional of layers, with the exception that the second gate electrodes (11) do not reach into the source region (7), as depicted in the IGBT 702 from FIG. 11C. Such a structure will have a horizontal MOS channel (15) and a vertical MOS channel (16).

With reference to both embodiments depicted in FIGS. 10A and 11A, the trench recesses embedding the second gate electrodes (11) can also be formed shallower than the fortifying layer (1).

For all the embodiments described above, the fortifying layer (1) is preferably electrically biased through additional contacts made at the semiconductor die level (i.e. not necessarily at a transistor cell level in order to avoid significant interference in conduction mode), or can be left electrically floating.

Figure 12:
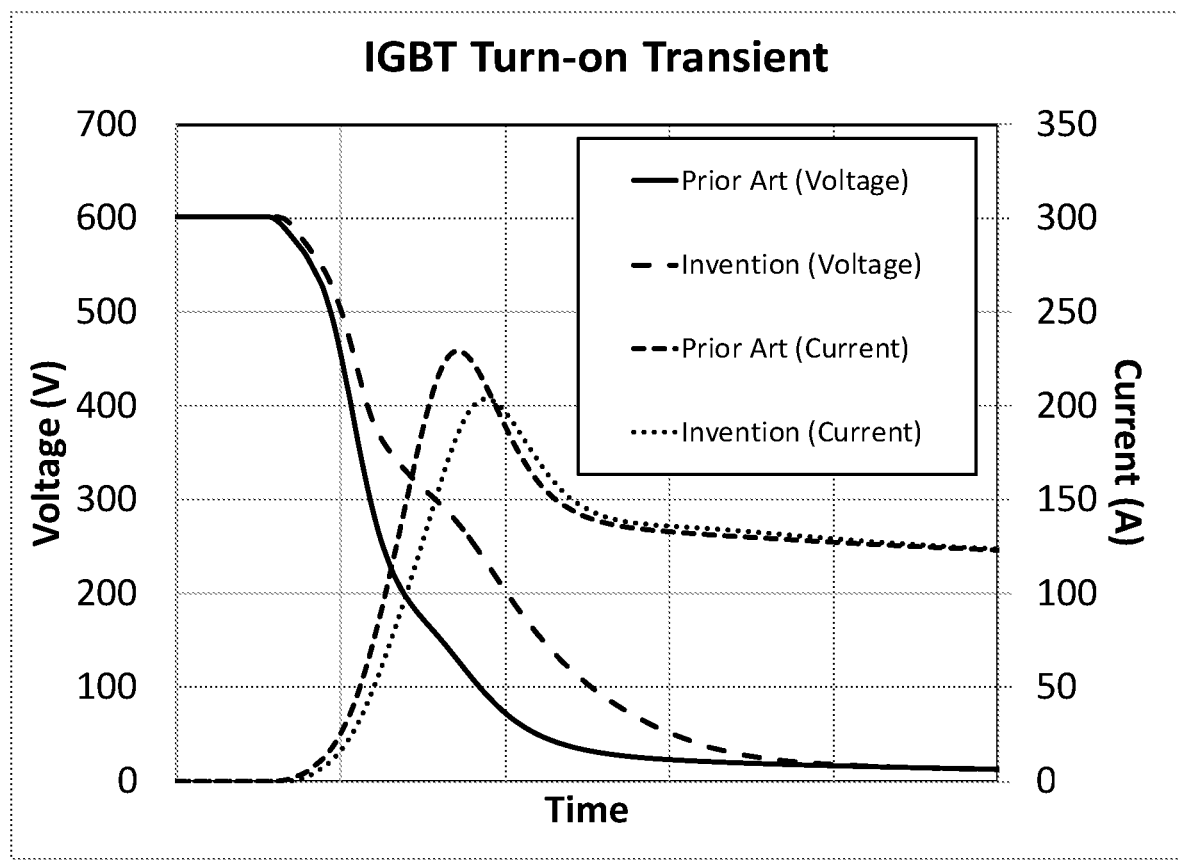
FIG. 12: shows the simulation results comparing the turn-on process of a Prior Art IGBT with an IGBT according to the invention.

It is also worth noting the simulation results depicted in FIG. 12, which compare the turn-on voltage and current waveforms for an IGBT according to the prior art, and according to this invention. The rate of increase of the current is slowed down for the new IGBT because the input capacitance of the semiconductor device has been reduced as discussed previously. This has the consequence of improving the controllability of the semiconductor device, allowing all the MOS cells to enter conduction mode, instead of one cell becoming conductive before all the others. This advantage could be extremely relevant for semiconductor devices working at high voltages above 600 Vdc, and high currents, under short-circuit conditions.

It is possible to apply the invention to semiconductor devices in which the conductivity type of all layers is reversed, i.e. with a lightly P-doped drift layer. Or semiconductors in which the drift layer is formed of a wide bandgap semiconductor material such as SiC, GaN, Gallium Oxide, ZnO, Aluminium Oxide, Diamond, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE LIST

1: fortifying layer
2: collector metallization (electrode)
21: collector side
3: emitter metallization (electrode)
31: emitter side
4: drift layer, substrate
5: buffer layer
6: collector layer
7: source regions
8: second base layer
9: first base layer
10: planar gate electrode, electrically conductive layer
10': uncovered trench gate electrode
11: trench gate electrode, electrically conductive layer
12: insulating gate oxide for electrode 10
12': insulating gate oxide for electrode 11
13: insulation layer for planar cell and trench cell
13': field oxide layer
14: emitter contact opening
15: horizontal channel for planar gate
17: carrier enhancement layer
17': additional separation layer (P-type or N-type doped)

100: planar MOS cell power semiconductor device (prior art)
101: planar MOS cell power semiconductor device with enhancement layer (prior art)
102: planar MOS cell power semiconductor device with field oxide (prior art)
200: trench MOS cell power semiconductor device (prior art)
201: trench MOS cell power semiconductor device with enhancement layer (prior art)
300: trench planar MOS cell power semiconductor device (prior art)
400: trench planar MOS cell power semiconductor device with enhancement layer and single planar MOS channel (prior art)
401: trench planar MOS cell power semiconductor device with enhancement layer with planar and trench MOS channels (prior art)
450: trench planar MOS cell power semiconductor device with gate trenches orthogonal to the longitudinal direction of the planar cells (prior art)
500 to 505: fortified enhanced planar MOS cell power semiconductor devices according to various embodiments
600 to 601: fortified enhanced planar trench MOS cell power semiconductor devices with gate trenches according to various embodiments
700 to 702: fortified enhanced planar trench MOS cell power semiconductor devices with gate trenches orthogonal to the longitudinal direction of the planar cells, according to various embodiments

The invention claimed is:

1. A semiconductor device comprising multiple transistor cells, each cell further comprising:
    a drift layer of a silicon, a silicon carbide (SiC), or a wide bandgap semiconductor material, having a first conductivity type with a first doping concentration, and having a first main surface and a second main surface;
    a first base layer having a second conductivity type, disposed at the first main surface of the drift layer, and extending into the drift layer;
    one or more source regions having the first conductivity type disposed at the first main surface of the drift layer, directly adjacent to the first base layer and surrounded by the first base layer, wherein a doping concentration of the one or more source regions is higher than the first doping concentration;
    a first main electrode formed on the first main surface of the drift layer, in direct contact with the one or more source regions through a contact opening;
    a second base layer of the second conductivity type, with higher doping concentration than the first base layer, and disposed in a same plane over a portion of the first base layer, wherein the second base layer is disposed under the contact opening, in direct contact with the first main electrode, and partially embedding the one or more source regions;
    a carrier density enhancement layer of the first conductivity type, generating a barrier to the direct flow of charge carriers into the first main electrode, formed on the periphery of the first base layer, in contact with the first base layer and separating the first base layer from the drift layer; characterized in that, a doping concentration of the carrier density enhancement layer is higher than the first doping concentration;
    a fortifying layer of the second conductivity type, arranged directly adjacent to the carrier density enhancement layer, formed between the carrier density enhancement layer, and the drift layer, and separates a bottom side of a first insulating layer from the drift layer; wherein the peak doping concentration of the fortifying layer is less than $5\times10^{16}/cm^3$; wherein the fortifying layer is biased through an additional electrical contact outside the transistor cell; characterized in that, the fortifying layer extends into the drift layer at a depth that is less than or equal to the depth of the carrier density enhancement layer;
    a planar gate electrode, of a heavily doped polycrystalline layer or a metal-containing layer, arranged at the first main surface of the drift layer, and electrically insulated from the first base layer, the source regions, the carrier density enhancement layer, the fortifying layer, and the drift layer by the first insulating layer; wherein the said first insulating layer is in contact with at least the first base layer, the one or more source regions, and the fortifying layer.

2. A semiconductor device according to claim 1, wherein the fortifying layer extends into the drift layer at a maximum depth that is greater or equal to the depth of the carrier density enhancement layer.

3. A semiconductor device according to claim 1, wherein the said first insulating layer comprises at least a first portion and a second portion the first portion formed directly adjacent to the source region, the first base layer, the carrier density enhancement layer, and the fortifying layer; wherein the at least second portion is thicker than the first portion, and is formed directly adjacent to the fortifying layer.

4. A semiconductor device according to claim 3, wherein the fortifying layer is interrupted by the drift layer in the regions under the second portion of the first insulating layer.

5. A semiconductor device according to claim 1, wherein the fortifying layer is separated from the first insulating layer, and/or the drift layer by additional layers of the first or second conductivity type.

6. A semiconductor device according to claim 1, wherein one or more second gate electrodes of a heavily doped polycrystalline layer or a metal-containing layer are embedded in corresponding trench recesses arranged on the first main surface of the drift layer; characterized in that:
    each of the one or more secondary gate electrodes is separated from surrounding layers by a second insulating layer,
    no portion of the said second insulating layer in the trench recesses is in direct contact with the carrier density enhancement layer,
    a substantial portion of the said second insulating layer in the trench recesses is in direct contact with at least the fortifying layer, and
    the longitudinal extension direction of the trench recesses is substantially aligned with the longitudinal extension direction of the one or more source regions, in a top plan view of the first main surface.

7. A semiconductor device according to claim 6, wherein the trench recesses embedding the one or more second gate electrodes extend in the drift layer to a depth that is greater than or equal to a maximum depth of the fortifying layer.

8. A semiconductor device according to claim 6, wherein the first and the one or more second gate electrodes are electrically connected.

9. A semiconductor device according to claim 6, wherein at least one of the one or more second gate electrodes are electrically connected to the first main electrode.

10. A semiconductor device according to claim 6, wherein at least one of the one or more second gate electrodes are electrically floating.

11. A semiconductor device according to claim 1, wherein one or more second gate electrodes of a heavily doped polycrystalline layer or a metal-containing layer are embedded in corresponding trench recesses arranged on the first main surface of the drift layer; characterized in that, in a top plan view of the first main surface of the drift layer, the trench recesses have a longitudinal extension direction oriented at an angle larger than 0° up to 90° with respect to a longitudinal extension direction of the one or more source regions and of the first base layer.

12. A semiconductor device according to claim 11, wherein in a top plan view of the first main surface of the drift layer, the trench recesses embedding the one or more second gate electrodes have a longitudinal extension direction oriented at a 90° angle with respect to the longitudinal extension direction of the one or more source regions and of the first base layer in the same top plan view; characterized in that the trench recesses abut the one or more source regions.

13. A semiconductor device according to claim 12, wherein the one or more source regions extend laterally to a position that is substantially same as the position of a lateral edge of the second base layer, when referenced to an edge of the contact opening.

14. A semiconductor device according to claim 12, wherein the one or more source regions extend laterally to a position that is substantially different than the position of a lateral edge of the second base layer, when referenced to an edge of the contact opening.

15. A semiconductor device according to claim 11, wherein in a top plan view of the first main surface of the drift layer, the trench recesses embedding the one or more second gate electrodes have a longitudinal extension direction oriented at a 90° angle with respect to the longitudinal extension direction of the one or more source regions and of the first base layer in the same top plan view; wherein the trench recesses do not abut the one or more source regions.

16. A semiconductor device according to claim 1, having a stripe layout design or cellular layout design shaped as a square, a rectangle, a circle, or a hexagon, or any other polygon shape.

17. A semiconductor device according to claim 1, wherein the transistor cells are a field effect transistor (FET), an insulated gate bipolar transistor (IGBT), insulated base MOS-controlled thyristor (IBMCT), a junction field effect transistor (JFET), or a metal-semiconductor field effect transistor (MESFET).

18. A semiconductor device according to claim 1, further comprising:
a reverse conducting type device with a shorted collector layer arranged at the second main surface of the drift layer between a second main electrode and a buffer layer, wherein, the shorted collector layer is formed by a pattern of opposite first and second conductivity type regions; wherein the buffer layer of the first conductivity type is formed closest to the second main surface of the drift layer, and has a doping concentration higher than the first doping concentration.

19. A semiconductor device according to claim 1, wherein the fortifying layer is electrically floating.

20. A semiconductor module package comprising at least one semiconductor device with one or more transistor cells according to claim 1.

* * * * *